(12) United States Patent
Kinoshita et al.

(10) Patent No.: US 7,864,623 B2
(45) Date of Patent: Jan. 4, 2011

(54) SEMICONDUCTOR DEVICE HAVING LATENCY COUNTER

(75) Inventors: Hiroto Kinoshita, Tokyo (JP); Hiroki Fujisawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/728,642

(22) Filed: Mar. 22, 2010

(65) Prior Publication Data
US 2010/0177589 A1 Jul. 15, 2010

Related U.S. Application Data

(63) Continuation-in-part of application No. 12/171,697, filed on Jul. 11, 2008, now Pat. No. 7,715,272.

(30) Foreign Application Priority Data
May 22, 2008 (JP) .............................. 2008-134839

(51) Int. Cl.
*G11C 8/00* (2006.01)
(52) U.S. Cl. .............. 365/233; 365/230.04; 365/230.06
(58) Field of Classification Search ................. 365/233, 365/230.08, 230.04, 230.06
See application file for complete search history.

(56) References Cited

U.S. PATENT DOCUMENTS

| 5,404,338 A | 4/1995 | Murai et al. |
| 5,517,462 A | 5/1996 | Iwamoto et al. |
| 5,815,462 A | 9/1998 | Konishi et al. |
| 6,337,832 B1 * | 1/2002 | Ooishi et al. ............ 365/233.12 |
| 6,618,319 B2 | 9/2003 | Ooishi et al. |
| 6,853,589 B2 * | 2/2005 | Tojima et al. ........... 365/189.05 |
| 7,177,231 B2 * | 2/2007 | Johnson et al. ......... 365/233.11 |
| 7,239,576 B2 * | 7/2007 | Shimbayashi ............ 365/233.5 |
| 7,580,321 B2 * | 8/2009 | Fujisawa et al. .......... 365/233.1 |
| 7,624,225 B2 * | 11/2009 | Gower et al. ................. 711/105 |
| 2007/0091714 A1 | 4/2007 | Fujisawa et al. |

FOREIGN PATENT DOCUMENTS

JP 2007-115351 A 5/2007

* cited by examiner

*Primary Examiner*—Tuan T. Nguyen
(74) *Attorney, Agent, or Firm*—Sughrue Mion, PLLC

(57) ABSTRACT

A semiconductor device includes a latency setting circuit setting the latency, an input command circuit outputting a normal-phase (reverse-phase) command signal obtained by capturing an input command signal using a normal-phase (reverse-phase) clock, first and second counter circuits each including latch circuits sequentially shifting the normal-phase (reverse-phase) command signal based on the normal-phase (reverse-phase) clock, a selector circuit controlling a signal path so that the normal-phase (reverse-phase) command signal is transmitted through the first (second) counter circuit when an even latency is set and the normal-phase (reverse-phase) command signal is transmitted so as to be shifted from the first (second) counter circuit to the second (first) counter circuit when an odd latency is set, and a control circuit controlling so that the latch circuits of the first (second) counter circuit are activated in response to the input command signal and stopped after an operation period is elapsed.

14 Claims, 18 Drawing Sheets

FIG.7

| LATENCY | SETTING OF SIGNAL PATHS (WHEN CMD0 IS INPUT) |
|---|---|
| 3 | CMD0 → S3 → OR1 → Se → Sx → CMDout |
| 4 | CMD0 → S1 → OR0 → SE → SX → CMDout |
| 5 | CMD0 → S2 → Sd → OR1 → Se → Sx → CMDout |
| 6 | CMD0 → SA → S1 → OR0 → SE → SX → CMDout |
| 7 | CMD0 → SA → S2 → Sd → OR1 → Se → Sx → CMDout |
| 8 | CMD0 → SA → SB → S1 → OR0 → SE → SX → CMDout |
| 9 | CMD0 → SA → SB → S2 → Sd → OR1 → Se → Sx → CMDout |
| 10 | CMD0 → SA → SB → SC → S1 → OR0 → SE → SX → CMDout |
| 11 | CMD0 → SA → SB → SC → S2 → Sd → OR1 → Se → Sx → CMDout |

SEMICONDUCTOR DEVICE HAVING LATENCY COUNTER

The present application is a continuation-in-part of U.S. application Ser. No. 12/171,697, filed Jul. 11, 2008, which claims priority to Japanese Patent Application No. 2008-134839 filed on May 22, 2008. The entire disclosures of the prior applications are hereby incorporated by reference.

BACKGROUND OF THE INVENTION

1. Field of the Invention

The present invention relates to a semiconductor device which operates in synchronization with a clock, and particularly relates to a synchronous semiconductor device having a configuration for controlling operation timings after issuing various commands in response to latencies.

2. Description of Related Art

Recently SDRAM (Synchronous Dynamic Random Access Memory) of DDR (Double Data Rate) type has been a mainstream as a synchronous semiconductor memory device to allow high speed operation. Since this DDR-SDRAM (referred to as DDR-SDRAM hereinafter) is provided with a latency counter in which the number of clock cycles required between issuing a command and completing data transmission in read/write operation is set as a latency and the set latency is counted based on an internal clock. In the DDR-SDRM, different latencies are defined for various types of operations and a user can preset a desired latency in a mode register.

Meanwhile, as the speed of an external clock of the DDR-SDRAM increases, a multistage latency counter capable of corresponding to latencies covering a wide range is required. Therefore, an increase in consumption current becomes a problem. A configuration is proposed in Patent Reference 1 given below as a latency counter capable of suppressing an increase in consumption current. The patent reference 1 discloses the latency counter of a dual-phase configuration including dual counter circuits in each of which the external clock is frequency-divided by two to generate internal clocks having phases different by 180 degrees from each other, and the counter circuits are synchronized with the internal clocks respectively. As shown in FIG. 2 of the patent reference 1, the operation of selectors is controlled in response to a set latency, and a signal path through either or both of the dual counter circuits is formed for an input command signal, thereby selectively counting even latencies and odd latencies. By this configuration, the internal clocks whose frequency is half that of the external clock can be used, and thus, it is effective for reducing the consumption current.

Patent Reference 1: Japanese Patent Application Laid-open No. 2007-115351

However, as the speed of the external clock of the DDR-SDRAM further increases, the consumption current in the conventional latency counter is required to be further reduced. Particularly, internal clocks obtained by frequency-dividing the external clock by two are respectively applied to a large number of D flip flops forming the dual counter circuits, the magnitude of the overall consumption current becomes negligible. Although the input command signal is activated within a limited period in the latency counter disclosed in the Patent Reference 1, it is in a state where the current always keeps flowing because the internal clocks are constantly operating. In this manner, when using a faster external clock in the conventional latency counter, a problem arises that there is a limit to suppress the consumption current.

SUMMARY

The present invention seeks to solve the above problem and provides a semiconductor device having a configuration in which consumption current can be sufficiently suppressed when using a high-speed external clock and many latencies can be counted with sufficient margin for operation timings.

In one aspect of the invention, there is provided a semiconductor device comprising: an input command circuit receiving command information and producing a first command signal based on a first clock signal and a second command signal based on a second clock signal, the first clock signal being different in phase from the second clock signal; a first shifter circuit shifting the first command signal in response to the first clock signal; a second shifter circuit shifting the second command signal in response to the second clock signal; a selector circuit providing a signal path such that when an even latency is set, the first command signal is transmitted through the first shifter circuit and the second command signal is transmitted through the second shifter circuit, and when an odd latency is set, the first command signal is transmitted through the second shifter circuit and the second command signal is transmitted through the first shifter circuit.

In another aspect of the invention, there is provided a semiconductor device counting a latency using a normal-phase clock and a reverse-phase clock which have phases in a mutually complementary relation and are obtained by frequency-dividing an external clock by two, comprising: a latency setting circuit capable of selectively setting the latency within a range of a predetermined number of clock cycles of the external clock; an input command circuit outputting a normal-phase command signal obtained by capturing an input command signal using the normal-phase clock and a reverse-phase command signal obtained by capturing the input command signal using the reverse-phase clock; a clock control circuit outputting a normal-phase control clock controlled to be activated and stopped corresponding to a predetermined operation period defined by a setting of the latency based on the normal-phase clock, and outputting a reverse-phase control clock controlled to be activated and stopped corresponding to a predetermined operation period defined by a setting of the latency based on the reverse-phase clock; a first counter circuit including a plurality of latch circuits sequentially shifting the normal-phase command signal based on the normal-phase clock, the first counter circuit including at least one latch circuit operating in synchronization with the normal-phase clock and at least one latch circuit operating in synchronization with the normal-phase control clock; a second counter circuit including a plurality of latch circuits sequentially shifting the reverse-phase command signal based on the reverse-phase clock, the second counter circuit including at least one latch circuit operating in synchronization with the reverse-phase clock and at least one latch circuit operating in synchronization with the reverse-phase control clock; and a selector circuit selectively controlling a signal path so that when an even latency is set, the normal-phase command signal is transmitted through the first counter circuit while the reverse-phase command signal is transmitted through the second counter circuit, and when an odd latency is set, the normal-phase command signal is transmitted so as to be shifted from the first counter circuit to the second counter circuit while the reverse-phase command signal is transmitted so as to be shifted from the second counter circuit to the first counter circuit. In the semiconductor device, the first counter circuit includes one or more latch circuits operating in synchronization with the normal-phase clock and one or more latch circuits operating in synchronization with the normal-phase control clock, and the second counter circuit includes one or more latch circuits operating in synchronization with the reverse-phase clock and one or more latch circuits operating in synchronization with the reverse-phase control clock.

According to the aspects of the invention, when counting various latencies, the respective latch circuits operate using the normal-phase clock and the reverse-phase clock obtained by frequency-dividing the external clock by two and using the normal-phase control clock and the reverse-phase control clock which are activated if required. Thus, the normal-phase clock and the reverse-phase clock constantly operate, while the normal-phase control clock and the reverse-phase control clock are activated only during the operation period set for the input command signal, and thereby the consumption current of the latch circuits to which the above-mentioned clocks are applied can be reliably reduced. In this case, by applying the normal-phase clock and the reverse-phase clock to some latch circuits having crucial condition for timing, sufficient margin for a counting operation can be obtained.

In further another aspect of the invention, there is provided a semiconductor device including: the latency setting circuit; the input command circuit; a clock control circuit outputting a normal-phase control clock controlled to be activated and stopped corresponding to the normal-phase command signal delayed by a predetermined delay time, a predetermined operation period defined by a setting of the latency, and the reverse-phase command signal, based on the normal-phase clock, and outputting a reverse-phase control clock controlled to be activated and stopped corresponding to the reverse-phase command signal delayed by a predetermined delay time, a predetermined operation period defined by a setting of the latency, and the normal-phase command signal, based on the reverse-phase clock; the first counter circuit including the plurality of latch circuits in the first counter circuit operating in synchronization with the normal-phase control clock; the second counter circuit including the plurality of latch circuits in the second counter circuit operating in synchronization with the reverse-phase control clock; and the selector circuit. Then, in the semiconductor device, latch circuits in the first counter circuit operate in synchronization with the normal-phase control clock, and latch circuits in the second counter circuit operate in synchronization with the reverse-phase control clock.

According to the semiconductor memory of this aspect of the invention, when counting various latencies, the normal-phase control clock and the reverse-phase control clock, which are activated if required, are applied to all the latch circuits included in the counter circuit. Therefore, the normal-phase clock and the reverse-phase clock, which operate constantly, are not required to be applied to the latch circuits, and the consumption current can be drastically reduced. In this case, by using the reveres-phase command signal in the clock control circuit of the normal-phase side and using the normal-phase command signal in the clock control circuit of the reverse-phase side, a latch circuit can be rapidly operated immediately after the signal path is shifted, so that sufficient margin for the counting operation can be assured.

As described above, according to the present invention, in a latency counter having a dual configuration using internal clocks obtained by frequency-dividing an external clock by two, a configuration is employed in which a normal-phase control clock and a reverse-phase control clock which are controlled to be activated and stopped corresponding to an operation period of an input command signal are generated, in addition to a normal-phase clock and a reverse-phase clock which operate constantly, so that the clocks are applied for synchronizing each latch circuit. Thus, the normal-phase control clock and the reverse-phase control clock can be stopped during a period in which the input command signal is inactivated, and thereby the overall consumption current in the latch circuits can be reduced. In this case, since the normal-phase clock and the reverse-phase clock are applied to latch circuits which have crucial condition for timing and are required to be rapidly operated, operating margin in a counting operation can be obtained.

Further, according to the present invention, in the latency counter having the dual configuration using the internal clocks obtained by frequency-diving the external clock by two, a configuration is employed in which only the normal-phase control clock and the reverse-phase control clock are applied for synchronizing each latch circuit, and the normal-phase command signal and the reverse-phase signal are used for controlling the normal-phase control clock and the reverse-phase control clock.

Thus, clocks applied to all the latch circuits can be stopped during the period in which the input command signal is inactivated, and thereby the consumption current can be further reduced. In this case, since an operation of a latch circuit immediately after an signal path is shifted can be assured by utilizing an command signal of an opposite side, operating margin in the counting operation can be obtained.

Furthermore, according to the present invention, influence of hazards which possibly occur in the normal-phase control clock and the reverse-phase control clock can be avoided in a higher-speed operation.

BRIEF DESCRIPTION OF THE DRAWINGS

The above featured and advantages of the present invention will be more apparent from the following description of certain preferred embodiments taken in conjunction with the accompanying drawings, in which:

FIG. 7 is a diagram showing a setting of signal paths when counting latencies 3 to 11 in the first embodiment;

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter three embodiments corresponding to three configurations of a synchronous semiconductor memory device will be described. The synchronous memory device to which the present invention is applied may be, for example, a DDR-SDRAM having a latency counter for counting latencies set for various commands.

First Embodiment

Figure 1:
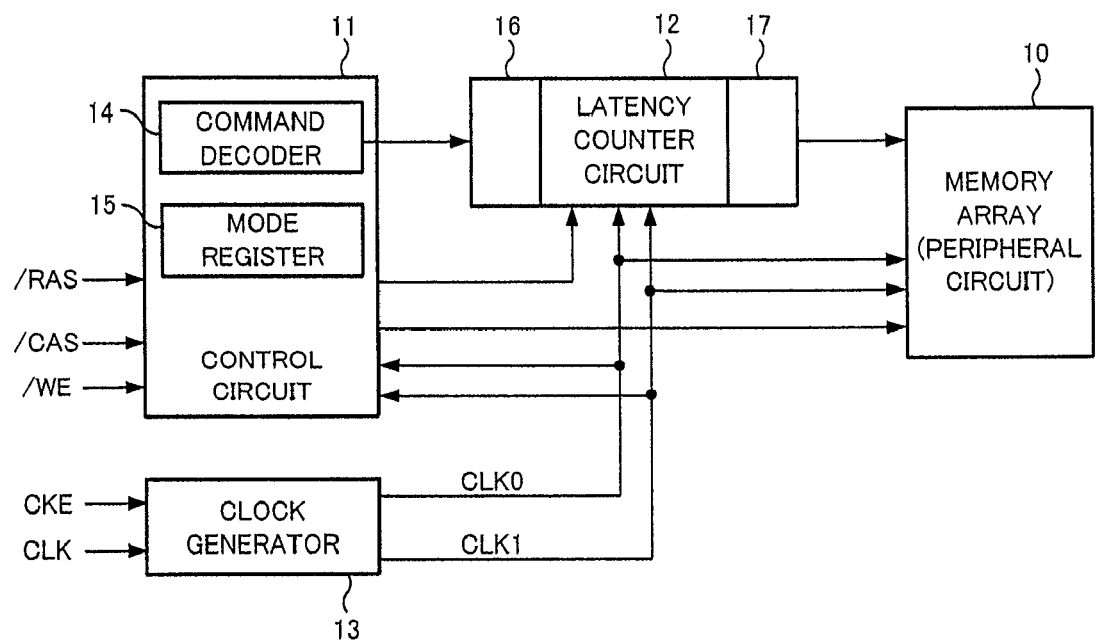
FIG. 1 is a block diagram showing a principal configuration of a synchronous semiconductor memory device of a first embodiment.

FIG. 1 is a block diagram showing a principal configuration of a synchronous semiconductor memory device of a first embodiment. The synchronous semiconductor memory device as shown in FIG. 1 includes a memory array 10, a control circuit 11, a latency counter circuit 12 and a clock generator 13. Further, there are provided a command decoder 14 and a mode register 15 which are included in the control circuit 11, and there are also provided an input command latch circuit 16 and an output command latch circuit 17 which are attached to the latency counter circuit 12. Actually the synchronous semiconductor memory device includes many other components, but only components related to the function based on the present invention are shown in FIG. 1.

In the above-mentioned configuration, the memory array 10 includes a plurality of memory cells formed at intersections of a plurality of word lines and a plurality of bit lines arranged in a matrix, and a read/write operation is performed with respect to memory cells corresponding to a designated address. Peripheral circuits required for selecting operations of word lines and bit lines are added to the memory array 10. The control circuit 11 controls the entire operation of the synchronous semiconductor memory device of the first embodiment and sends control signals to respective parts. The command decoder 14 in the control circuit 11 decodes an input external command and outputs a command signal corresponding to a command type, and the mode register 15 (the latency setting circuit of the invention) in the control circuit 11 functions to store operation modes capable of being set for the synchronous semiconductor memory device. Here, external commands are defined corresponding to combination patterns of various control signals (a row address strobe signal/RAS, a column address strobe signal/CAS, and a write enable signal/WE) input from outside to the control circuit 11.

The clock generator 13 generates a normal-phase clock CLK0 and a reverse-phase clock CLK1 based on the input external clock CLK, which are two internal clocks into which the external clock CLK is frequency-divided by two. Phases of the normal-phase clock CLK0 and the reverse-phase clock CLK1 are in a mutually complementary relation. The normal-phase clock CLK0 and the reverse-phase clock CLK1 have a period 2tCK twice a period tCK of the external clock CLK. As shown in FIG. 1, the normal-phase clock CLK0 and the reverse-phase clock CLK1 are sent to the memory array 10, the control circuit 11 and the latency counter circuit 12 respectively from the clock generator 13 in order to control operation timings. The validity of the external clock CLK is determined based on a clock enable signal CKE input to the clock generator 13.

In the synchronous semiconductor memory device of the first embodiment, the latency counter circuit 12 is a circuit for counting a latency (the number of clock cycles), which is set in accordance with an operation defined by the external command, in synchronization with the normal-phase clock CLK0 or the reverse-phase clock CLK1. The input command latch circuit 16 (the input command circuit of the present invention) captures the input command signal from the command decoder 11 using the normal-phase clock CLK0 or the reverse-phase clock CLK1 and latches it, and outputs dual command signals to the latency counter circuit 12. The output command latch circuit 17 receives the signal whose latency has been counted by the latency counter circuit 12 and latches it, and outputs the signal as an output command signal. In the latency counter circuit 12, there is provided a clock control circuit (not shown in FIG. 1) for controlling the normal-phase clock CLK0 and the reverse-phase clock CLK1 in accordance with an operation period set for the input command signal, which will be described in detail later.

Latencies according to operations of the synchronous semiconductor memory device are previously stored in the mode register 15 by setting from outside. For example, a CAS latency specifying the timing of data output in response to a read command and a write latency specifying the timing of data input in response to a write command are used. These latencies can be selectively set to arbitrary values within a predetermined range by a set command for the mode register 15. Therefore, the number of clock cycles to be counted by the latency counter circuit 12 is required to be variably controlled according to the type of the latency and the settable range. Detailed configuration and operation of the latency counter circuit 12 will be described later.

Although only a single latency counter circuit 12 is shown in FIG. 1, generally a plurality of latency counters 12 may be provided corresponding to command types or the like. Further, two latency counters 12 may be connected in cascade so as to count a latency obtained by adding two different latencies. For example, a configuration can be employed in which a latency counter circuit 12 for the above-mentioned CAS latency (CL) and a latency counter circuit 12 for an additive latency (AL) are connected in cascade so as to count a read latency (RL=CL+AL).

Figure 2:
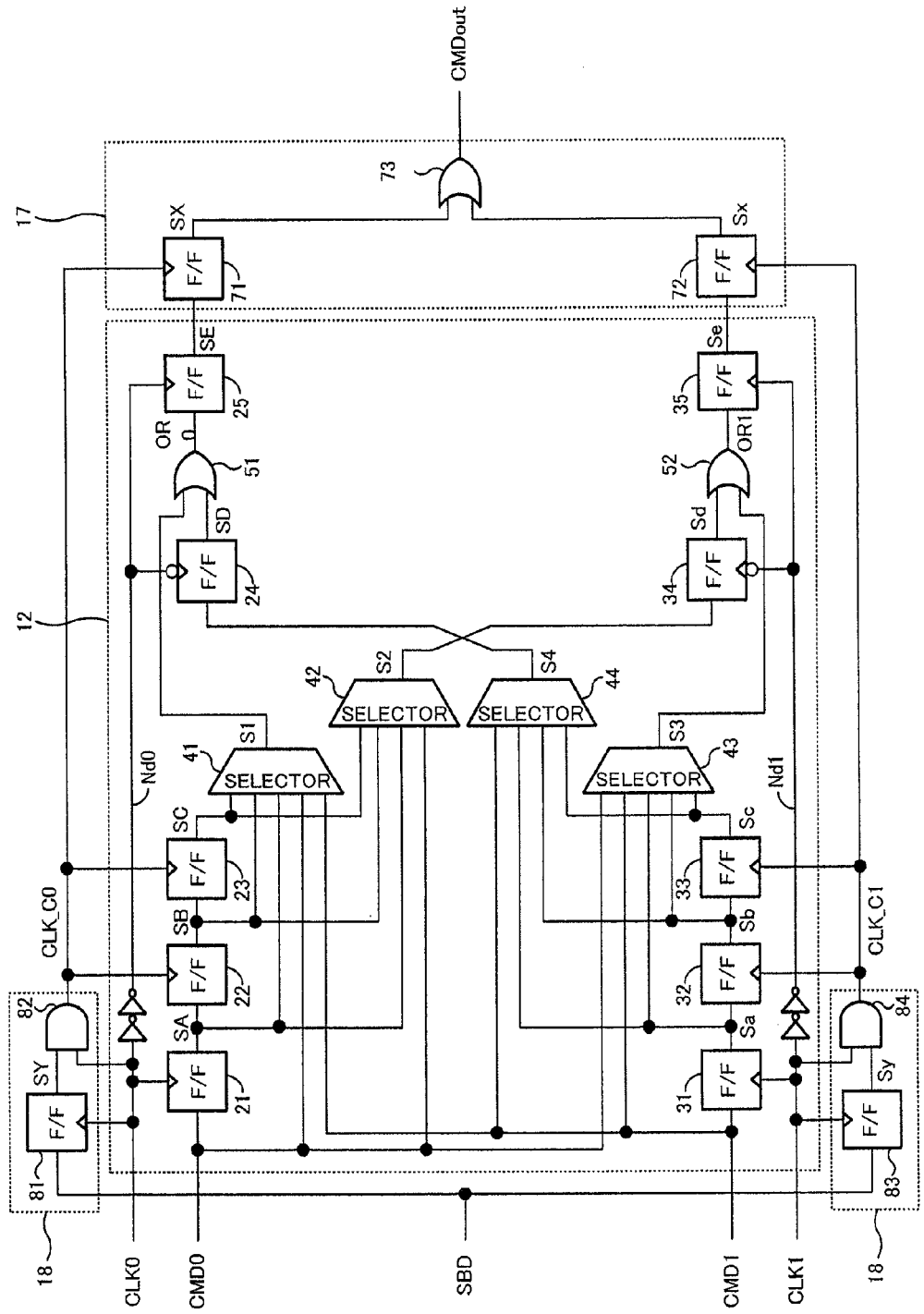
FIG. 2 a diagram showing a configuration example of an area including a latency counter circuit 12, an output command latch circuit 17 and a clock control circuit 18 in the first embodiment.
Figure 3:
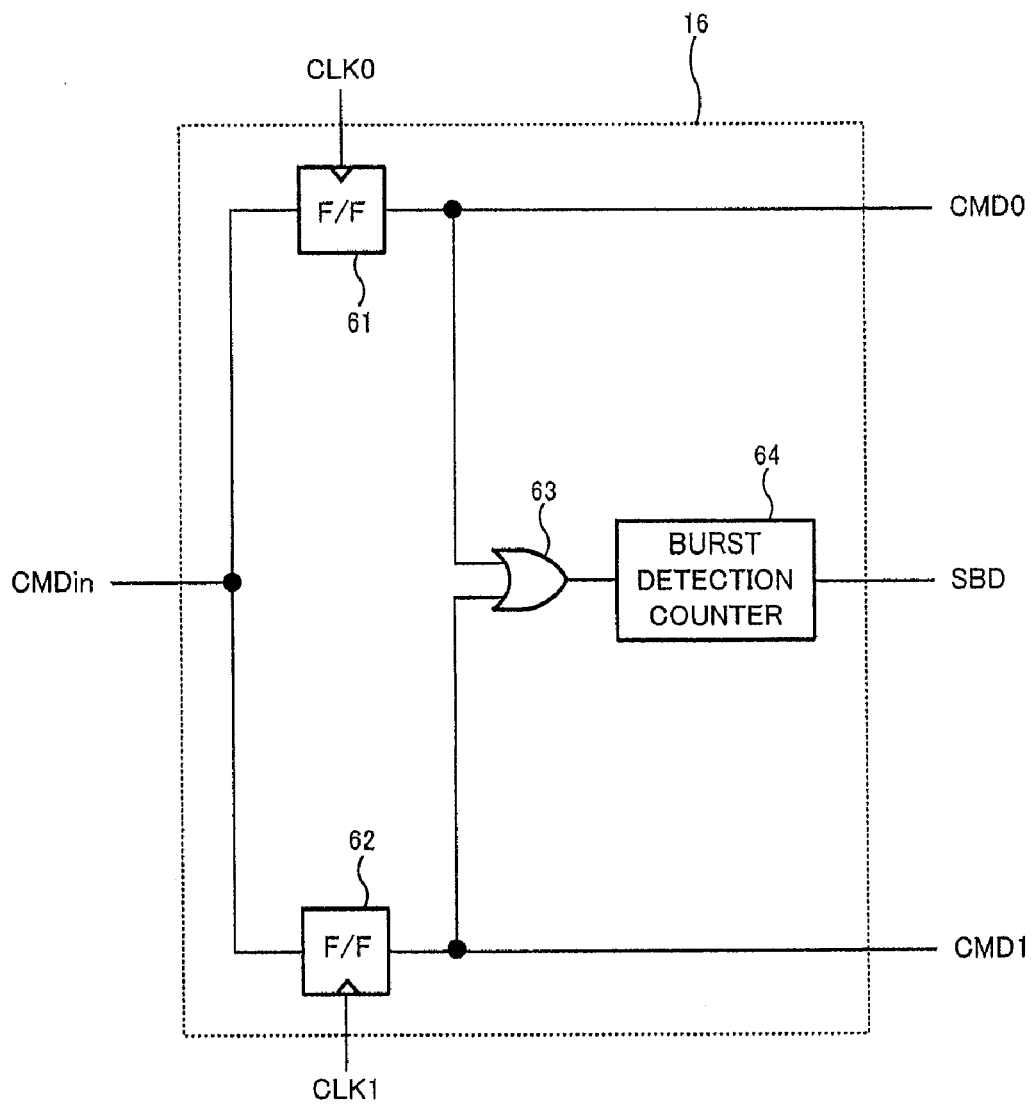
FIG. 3 is a diagram showing a configuration example of an input command latch circuit 16 in the first embodiment.

Next, a specific configuration example of the latency counter circuit 12 of the first embodiment will be described. FIG. 2 shows the configuration example of an area including the latency counter circuit 12 and the output command latch circuit 17 and including clock control circuits 18 attached to the latency counter circuit 12, which are included in the configuration of FIG. 1. FIG. 3 shows a configuration example of the input command latch circuit 16 which is included in the configuration of FIG. 1. The latency counter circuit 12 shown in FIG. 2 can count nine steps of latencies 3 to 11 arbitrarily within a range from the minimum latency 3 to the maximum latency 11.

As shown in FIG. 3, the input command latch circuit 16 preceding the latency counter circuit 12 includes D flip flops 61, 62, an OR gate 63 and a burst detection counter 64. An input command signal CMDin output from the command decoder 14 is input to the respective D flip flops 61 and 62. One D flip flop 61 latches the input command signal CMDin in synchronization with the edge of the normal-phase clock CLK0 and outputs a normal-phase command signal CMD0. The other D flip flop 62 latches the input command signal CMDin in synchronization with the edge of the reverse-phase clock CLK1 and outputs a reverse-phase command signal CMD1. The normal-phase command signal CMD0 and the reverse-phase command signal CMD1 are input to the latency counter circuit 12.

The OR gate 63 receives the above normal-phase command signal CMD0 and the reverse-phase command signal CMD1, and an OR output therefrom is input to the burst detection counter 64. The burst detection counter 64 outputs a burst detection signal SBD (the state signal of the present invention) which is activated only during a predetermined operation period corresponding to a burst operation of the input command signal CMDin. A pulse condition of the burst detection signal SBD corresponding to the operation period of the input command signal CMDin is determined depending on the latency stored in the mode register 15 corresponding to the external command such as the read or write command input to the semiconductor memory device. The burst detection signal SBD output from the burst detection counter 64 is supplied to the clock control circuits 18, and is used for the clock control described later.

As shown in FIG. 2, the clock control circuits 18 are symmetrically arranged at the normal-phase side and the reverse-phase side respectively, each of which is composed of a D flip flop 81 (83) and an AND gate 82 (84). The D flip flop 81 of the normal-phase side latches the burst detection signal SBD in synchronization with the edge of the normal-phase clock CLK0 and outputs a signal SY. The AND gate 82 of the normal-phase side receives the signal SY and the normal-phase clock CLK0 and outputs the logical product as a normal-phase control clock CLK_C0. Meanwhile, the D flip flop 83 of the reverse-phase side latches the burst detection signal SBD in synchronization with the edge of the reverse-phase clock CLK1 and outputs a signal Sy. The AND gate 84 of the reverse-phase side receives the signal Sy and the reverse-phase clock CLK1 and outputs the logical product as a reverse-phase control clock CLK_C1. Accordingly, the normal-phase control clock CLK_C0 and the reverse-phase control clock CLK_C1 operate in the same manner as the normal-phase clock CLK0 and the reverse-phase clock CLK1 respectively during the burst detection signal SBD is activated, and are controlled to be stopped during other periods.

The latency counter circuit 12 includes D flip flops 21 to 25, 31 to 35 as a plurality of latch circuits, selectors 41 to 44 as a selector circuit, and OR gates 51 and 52. Here, the D flip flops 21 to 25 and the OR gate 51 in an upper portion of FIG. 2 function as the first counter circuit of the present invention, and the D flip flops 31 to 35 and the OR gate 52 in a lower portion of FIG. 2 function as the second counter circuit of the present invention.

In the configuration of FIG. 2, the normal-phase command signal CMD0 is input to the D flip flop 21 and the reverse-phase command signal CMD1 is input to the D flip flop 31. Among the D flip flops 21 to 23, which form a three-stage counter on the normal-phase side, the first-stage D flip flop 21 is synchronizes with the edge of the normal-phase clock CLK0, and the subsequent D flip flops 22 and 23 are synchronized with the edge of the normal-phase control clock CLK_C0. Similarly, among the D flip flops 31 to 33, which form a three-stage counter on the reverse-phase side, the first-stage D flip flop 31 is synchronized with the edge of the normal-phase clock CLK0, and the subsequent D flip flops 32 and 33 are synchronized with the edge of the reverse-phase control clock CLK_C1.

The four selectors 41 to 44 have a function to control switching of a signal path of the latency counter circuit 12 in response to the set latency. Control signals (not shown) for setting the signal path are individually supplied to the respective selectors 41 to 44. The selector 41 receives the normal-phase command signal CMD0, signals SA, SB and SC output from the three-stage D flip flops 21, 22 and 23 of the normal-phase side, and the reverse-phase command signal CMD1, and outputs a signal S1 corresponding to the selected signal path. The selector 42 receives the normal-phase command signal CMD0 and the above signals SA, SB and SC, and outputs a signal S2 corresponding to the selected signal path. Meanwhile, the selector 43 receives the reverse-phase command signal CMD1, signals Sa, Sb and Sc output from the three-stage D flip flops 31, 32 and 33 of the reverse-phase side, and the normal-phase command signal CMD0, and outputs a signal S3 corresponding to the selected signal path. The selector 44 receives the reverse-phase command signal CMD1 and the above signals Sa, Sb and Sc, and outputs a signal S4 corresponding to the selected signal path.

The D flip flop 24 latches the signal S4 of the reverse-phase side in synchronization with the falling edge of the normal-phase clock CLK0 at node Nd0, which is shaped by two-state inverters, and outputs a signal SD. The OR gate 51 outputs a signal OR0 which is a logical sum of the signal S1 of the selector 41 on the normal-phase side and the signal SD output from the D flip flop 24. The D flip flop 25 of the normal-phase side latches the signal OR0 in synchronization with the edge of the normal-phase clock CLK0 at the node Nd0, and outputs a signal SE.

The D flip flop 34 latches the signal S2 of the normal-phase side in synchronization with the falling edge of the reverse-phase clock CLK1 at node Nd1, which is shaped by two-state inverters, and outputs a signal Sd. The OR gate 52 outputs a signal OR1 which is a logical sum of the signal S3 of the selector 42 on the reverse-phase side and the signal Sd output from the D flip flop 34. The D flip flop 35 of the reverse-phase side latches the signal OR1 in synchronization with the edge of the reverse-phase clock CLK1 at the node Nd1, and outputs a signal Se.

The output command latch circuit 17 subsequent to the latency counter circuit 12 is composed of D flip flops 71, 72 and an OR gate 73. The signal SE output from one D flip flop 25 in the latency counter circuit 12 is input to the D flip flop 71 as a last stage of the first counter circuit, and the signal Se output from the other D flip flop 35 in the latency counter circuit 12 is input to the D flip flop 72 as the last stage of the second counter circuit.

The D flip flop 71 latches the signal SE in synchronization with the edge of the normal-phase control clock CLK_C0, and outputs a signal SX. The D flip flop 72 latches the signal Se in synchronization with the edge of the reverse-phase control clock CLK_C1, and outputs a signal Sx. The OR gate 73 takes a logical sum of the respective signal SX and Sx output from the D flip flops 71 and 72, which is output as an output command signal CMDout. The output command signal CMDout is used as the signal whose set latency has been counted for the input command signal CMDin, as described later.

Figure 4:
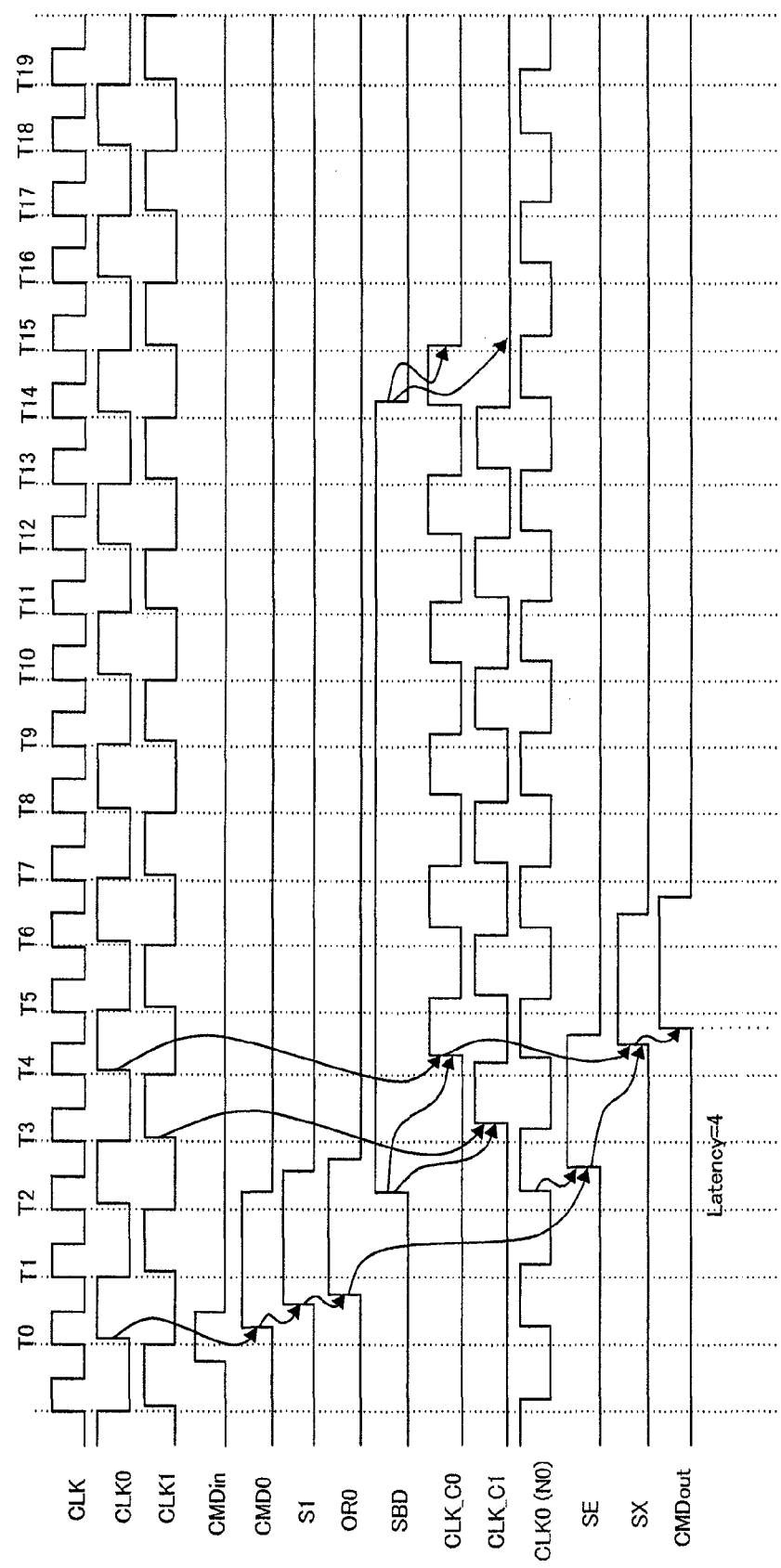
FIG. 4 is a diagram showing an example of operation waveforms when an even latency 4 is set in the first embodiment.
Figure 5:
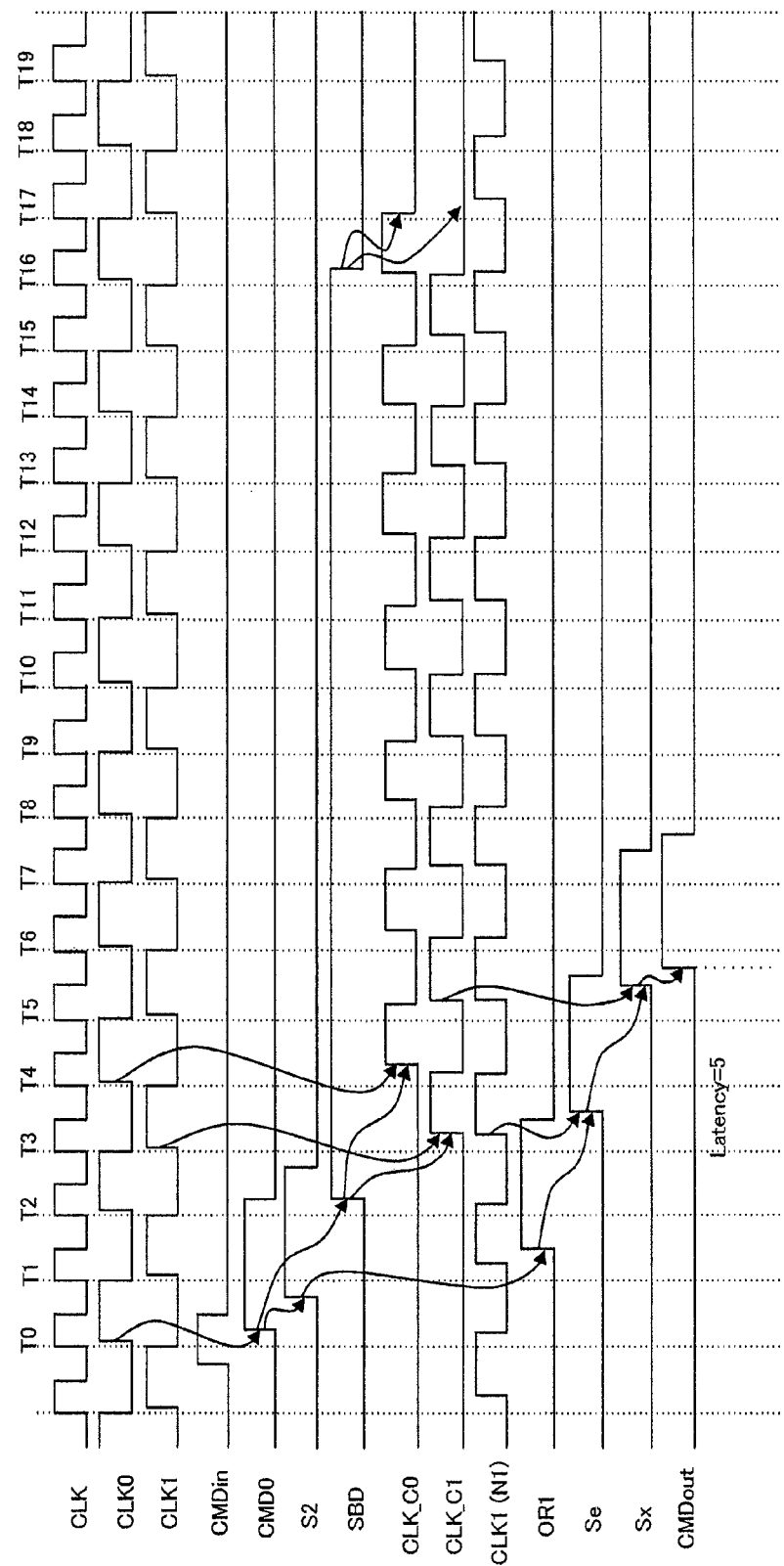
FIG. 5 is a diagram showing an example of operation waveforms when an odd latency 5 is set in the first embodiment.
Figure 6:
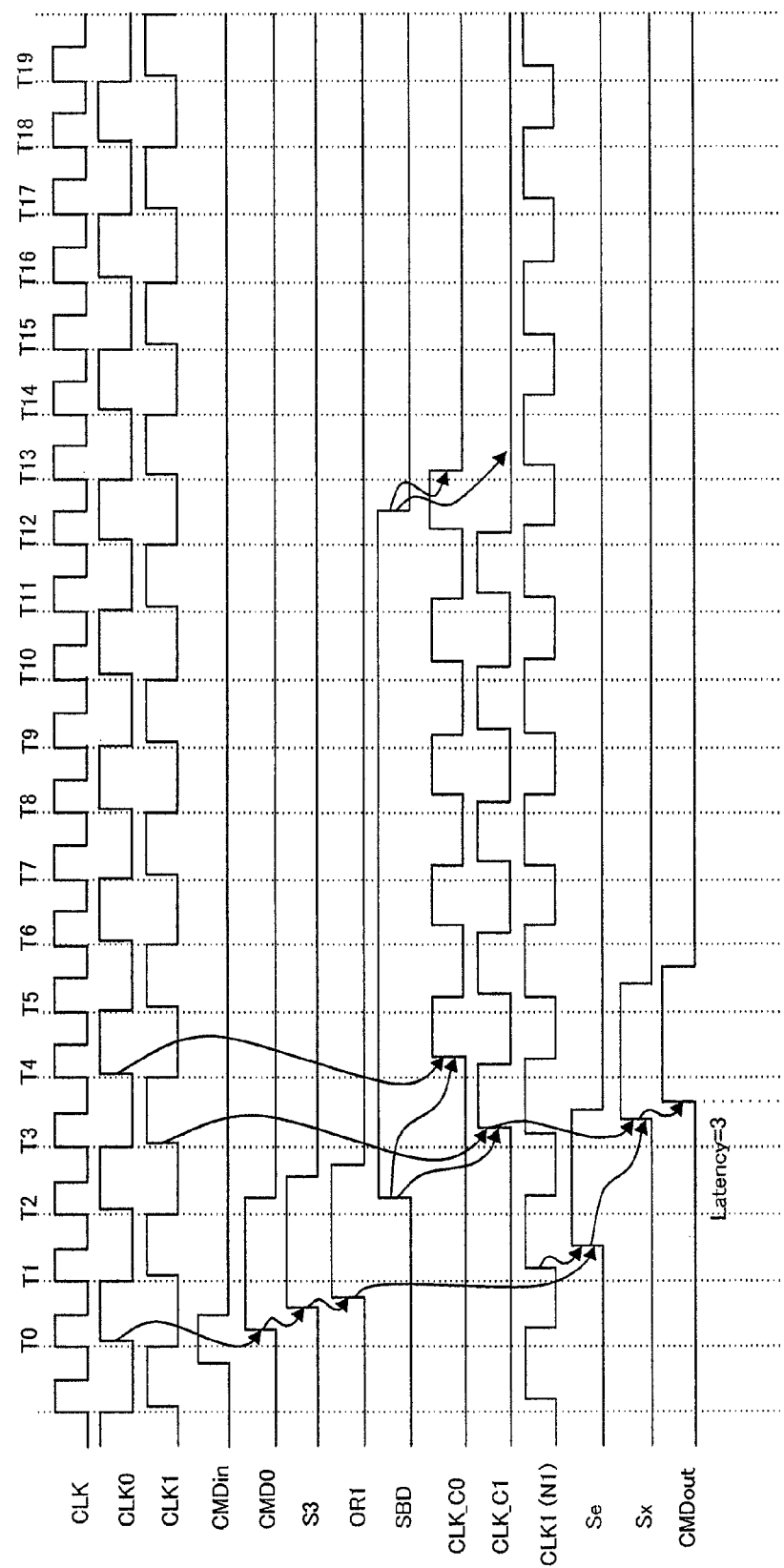
FIG. 6 is a diagram showing an example of operation waveforms when a minimum odd latency 3 is set in the first embodiment.

Counting operation of the latency in the first embodiment will be described with reference to FIGS. 4 to 6. FIG. 4 is an example of operation waveforms when an even latency 4 is set, FIG. 5 is an example of operation waveforms when an odd latency 5 is set, and FIG. 6 is an example of operation waveforms when a minimum odd latency 3 is set. Note that cycles T0 to T19 of the external clock CLK of the period tCK are shown in the uppermost parts of FIGS. 4 to 6. The normal-phase clock CLK0 and the reverse-phase clock CLK1 have a period 2tCK twice the period tCK of the external clock CLK.

First, the counting operation when the even latency 4 is set will be described using FIG. 4. As shown in FIG. 4, the normal-phase command signal CMD0 is input which is captured at cycle T0 by the normal-phase clock CLK0 for the input command signal CMDin. The normal-phase command signal CMD0 is a pulse maintaining High during a time period 2tCK. In the selector 41, a signal path of the normal-phase command signal CMD0 is selected by a control signal corresponding to the even latency 4. As a result, the signal S1 rises. The signal S1 is input to the OR gate 51, and the signal OR0 rises at a slightly delayed timing relative to the signal S1.

When the input command signal CMDin is input to the input command latch circuit 16, the burst detection signal SBD which changes to a high level at a predetermined timing is output by the burst detection counter 64. When the pulse of the burst detection signal SBD rises, the reverse-phase control clock CLK_C1 is activated at cycle T3 at which the reverse-phase clock CLK1 subsequently rises, and the normal-phase control clock CLK_C0 is activated at cycle T4 at which the normal-phase clock CLK0 subsequently rises.

The signal OR0 is input to the D flip flop 25, and the signal SE rises at the rising edge of cycle T2 of the normal-phase clock CLK0. Further, the signal SE is input to the D flip flop 71 in the output command latch circuit 17, and the signal SX rises at the rising edge of cycle T4 of the normal-phase control clock CLK_C0. Finally, the signal SX is input to the OR gate 73, and the output command signal CMDout rises at a slightly delayed timing relative to the signal SX.

After the normal-phase command signal CMD0 falls at cycle T2 in conjunction with the input command signal CMDin, the output command signal CMDout eventually falls at cycle T6 through the above-mentioned signal path. In this manner, after the input command signal CMDin is captured by the normal-phase clock CLK0 in the counting operation of FIG. 4, the output command signal CMDout delayed by four periods is generated. Therefore, the even latency 4 can be counted.

In addition, when the burst detection signal SBD falls at cycle T14, both the normal-phase control clock CLK_C0 and the reverse-phase control clock CLK_C1 are stopped at next cycle T15. Accordingly, in the configuration of FIG. 1, the D flip flops 22, 23, 71 to which the normal-phase control clock CLK_C0 is applied, and the D flip flops 32, 33, 72 to which the reverse-phase control clock CLK_C1 is applied are stopped until the burst detection signal SBD rises again. Thus, current flows only in a short time regarding six D flip flops of the first embodiment, and thus the consumption current can be drastically reduced.

Next, the counting operation when the odd latency 5 is set will be described using FIG. 5. In FIG. 5, operation waveforms of the external clock CLK, the normal-phase clock CLK0, the reverse-phase clock CLK1, the input command signal CMDin and the normal-phase command signal CMD0 are the same as those in FIG. 4. Meanwhile, the signal path for the odd latency 5 is different. In the selector 42, a signal path of the normal-phase command signal CMD0 is selected by a control signal corresponding to the odd latency 5. As a result, the signal S2 rises. Thereby, the signal path is shifted from the normal-phase side to the reverse-phase side, the signal S2 reaches the OR gate 52 through the D flip flop 34 of the reverse-phase side, and the signal OR1 rises at cycle T1.

The pulse of the burst detection signal SBD rises at the same timing as in FIG. 4, however the pulse width is lengthened due to an increment of the latency. The signal OR1 is input to the D flip flop 35, and the signal Se rises at the rising edge of cycle T3 of the reverse-phase clock CLK1. Further, the signal Se is input to the D flip flop 72 of the output command latch circuit, and the signal Sx rises at the rising edge of cycle T5 of the reverse-phase control clock CLK_C1. Finally the signal Sx is input to the OR gate 73, and the output command signal CMDout rises at a slightly delayed timing relative to the signal Sx.

After the normal-phase command signal CMD0 falls at cycle T2 in conjunction with the input command signal CMDin, the output command signal CMDout eventually falls at cycle T7 through the above-mentioned signal path. In this manner, after the input command signal CMDin is captured by the normal-phase clock CLK0 in the counting operation of FIG. 5, the output command signal CMDout delayed by five periods is generated. Therefore, the odd latency 5 can be counted.

In addition, after the burst detection signal SBD falls at cycle T16, both the normal-phase control clock CLK_C0 and the reverse-phase control clock CLK_C1 are stopped in the same manner as in FIG. 4. Thus, in the counting operation of FIG. 5, the same effect of reducing the consumption current as in the counting operation of FIG. 4 can be obtained.

Next, the counting operation when the minimum odd latency 3 is set will be described using FIG. 6. In FIG. 6, operation waveforms of the external clock CLK, the normal-phase clock CLK0, the reverse-phase clock CLK1, the input command signal CMDin and the normal-phase command signal CMD0 are the same as those in FIGS. 4 and 5. The signal path through which the normal-phase command signal CMD0 is shifted via the selector 43 of the reverse-phase side is used for the minimum odd latency 3, as different from the above odd latency 5. In the selector 43, a signal path of the normal-phase command signal CMD0 is selected by a control signal corresponding to the odd latency 3. As a result, the signal S3 rises at cycle T0. The signal S3 is input to the OR gate 52, and the signal OR1 rises at a slightly delayed timing relative to the signal S3.

The pulse of the burst detection signal SBD rises at the same timing as in FIGS. 4 and 5, however the pulse width is shortened due to smallness of the latency. The signal OR1 is input to the D flip flop 35, and the signal Se rises at the rising edge of cycle T1 of the reverse-phase clock CLK1. When comparing FIG. 6 with FIG. 5, since the D flip flop 34 preceding the OR gate 52 is bypassed, the rising timing of the signal OR1 is ahead of the signal Se. As a result, the signal Se rises ahead of the reverse-phase clock CLK1 by one period thereof.

Subsequently, operations of the D flip flop 35, the D flip flop 72 of the output command latch circuit 17, and the OR gate 73 are performed ahead of the operation waveforms in FIG. 5 by two periods. As a result, in the counting operation of FIG. 6, the output command signal CMDout delayed by three periods is generated after the input command signal CMDin is capture by the normal-phase clock CLK0. Therefore, the odd latency 3 can be counted.

As described above, the counting operations for the even latency 4 and the odd latencies 5 and 3 have been described respectively, however counting operations for other latencies can be applied by changing the setting of the signal path. Hereinafter, settings of the signal path corresponding to latencies 3 to 11 will be described with reference to FIG. 7. FIG. 7 shows signal paths set corresponding to the respective latencies 3 to 11 when the normal-phase command signal CMD0 is input in the configuration of FIG. 2. Note that the signal paths are represented by adding signal names of respective elements of FIG. 2 sequentially.

The description has been made using FIGS. 4 to 6 concerning the latencies 3 to 5 in FIG. 7. Meanwhile, the signal paths for the even latencies 6, 8 and 10 are formed so that the signal SA, SB and SC are selectively transmitted to the selector 41 through the D flip flops 21, 22 and 23 sequentially, relative to the above-mentioned even latency 4. Further, the signal paths for the odd latencies 7, 9 and 11 are formed so that the signal SA, SB and SC are selectively transmitted to the selector 42 through the D flip flops 21, 22 and 23 sequentially and shifted to the reverse-phase side, relative to the above-mentioned odd latency 5. In FIG. 7, the signal path via the selector 43 is formed only for the odd latency 3. In addition, concerning counting operations of the reverse-phase side, it may be considered that a signal path inversed upside down in FIG. 2 is formed when the reverse-phase command signal CMD1 is input.

As described above, according to the synchronous semiconductor memory device of the first embodiment, the counting operation is performed using the normal-phase control clock CLK_C0 and the reverse-phase control clock CLK_C1, which are controlled to be activated and stopped in accordance with the operation period of the command signals CMD0 and CMD1, in addition to the internal clocks (the normal-phase clock CLK0 and the reverse-phase clock CLK1) having twice the period tCK of the external clock CLK. Therefore, the consumption current can be reduced in comparison with the conventional configuration. That is, when the burst detection signal SBD is not activated, the consumption current is reliably reduced in the meantime because the D flip flops 22, 23, 71, 32, 33 and 72 do not operate. In this case, since the normal-phase clock CLK0 or the reverse-phase clock CLK1 having no delay is applied to the D flip flops 21, 24, 25, 31, 34 and 35 having crucial operation timings, an appropriate operating margin can be obtained.

Second Embodiment

Next, a synchronous semiconductor memory device of a second embodiment will be described. A principal configuration of the synchronous semiconductor memory device of the second embodiment is common to the block diagram of FIG. 1, so description thereof is omitted. In the second embodiment, configurations of the latency counter circuit 12 and the clock control circuits 18 in FIG. 2 are changed, and they will be represented as a latency counter circuit 12a and clock control circuits 18a below.

Figure 8:
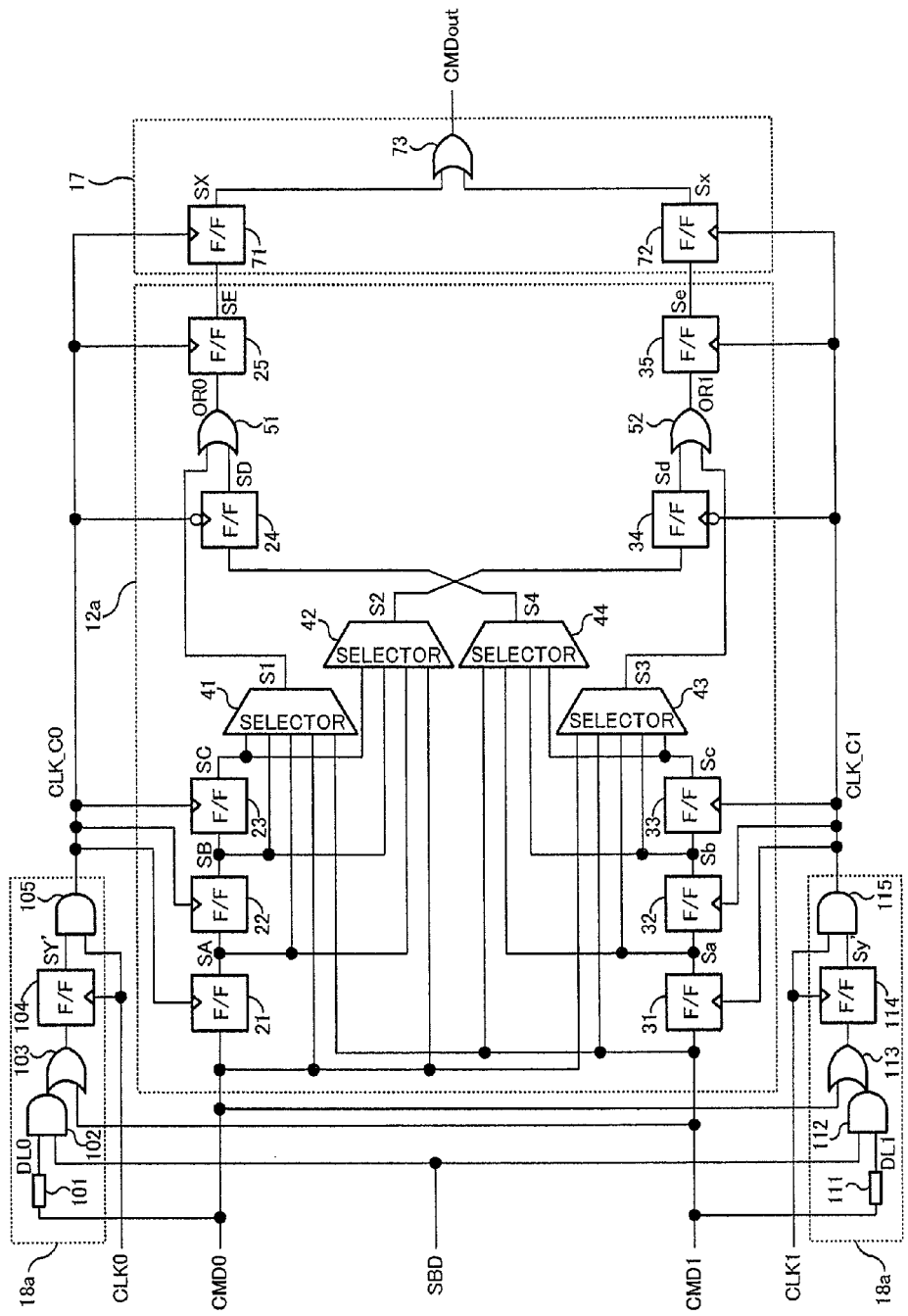
FIG. 8 a diagram showing a configuration example of an area including a latency counter circuit 12a, an output command latch circuit 17 and a clock control circuit 18a in a second embodiment.

FIG. 8 shows a configuration example of an area including the latency counter circuit 12a, the output command latch circuit 17 and the clock control circuits 18a. The latency counter circuit 12a shown in FIG. 8 can count nine steps of latencies 3 to 11 arbitrarily within the range from the minimum latency 3 to the maximum latency 11, in the same manner as the first embodiment. Here, the input command latch circuit 16 of the second embodiment has the same configuration as in FIG. 3 of the first embodiment.

Each of the clock control circuits 18a is equally provided on the normal-phase side and the reverse-phase side, and includes a delay element 101 (111), an OR gate 102 (112), an OR gate 103 (113), a D flip flop 104 (114), and an AND gate 105 (115). The normal-phase (reverse phase) command signal CMD0 (CMD1) is input to the delay element 101 (111) and a delayed command signal DL0 (DL1) which is delayed by a predetermined time is obtained. The OR gate 102 (112) receives the delayed command signal DL0 (DL1) and the burst detection signal SBD.

On the normal-phase side, the OR gate 103 receives an output signal of the OR gate 102 and the reverse-phase command signal CMD1. Then, the D flip flop 104 latches an output signal of the OR gate 103 in synchronization with the edge of the normal-phase clock CLK0, and outputs a signal SY'. The AND gate 105 receives the signal SY' and the normal-phase clock CLK0 and outputs the logical product as the normal-phase control clock CLK_C0. Meanwhile, on the reverse-phase side, the OR gate 113 receives an output signal of the AND gate 112 and the normal-phase command signal CMD0. Then, the D flip flop 114 latches an output signal of the OR gate 113 in synchronization with the reverse-phase clock CLK1, and outputs a signal Sy'. The AND gate 115 receives the signal Sy' and the reverse-phase clock CLK1 and outputs the logical product as the reverse-phase control clock CLK_C1. In this manner, it is a feature of the second embodiment that control using the reverse-phase command signal CMD1 is performed in the clock control circuit 18a of the normal-phase side, while control using the normal-phase command signal CMD0 is performed in the clock control circuit 18a of the reverse-phase side.

The latency counter circuit 12a includes D flip flops 21 to 25 and 31 to 35, selectors 41 to 44, and OR gates 51 and 52. Accordingly, the latency counter circuit 12a has the same basic configuration as that in FIG. 2 of the first embodiment, so different points will be described below. In the second embodiment, clocks applied to the respective D flip flops 21 to 25 and 31 to 35 are different from those of the first embodiment.

That is, the normal-phase control clock CLK_C0 is applied to all the D flip flops 21 to 25 of the normal-phase side, and the reverse-phase control clock CLK_C1 is applied to all the D flip flops 31 to 35 of the reverse-phase side. Thus, there are no D flip flops to which the normal-phase clock CLK0 or the reverse-phase clock CLK1 is applied in the second embodiment. This configuration is intended for the purpose of further reducing the consumption current, as described later.

Figure 9:
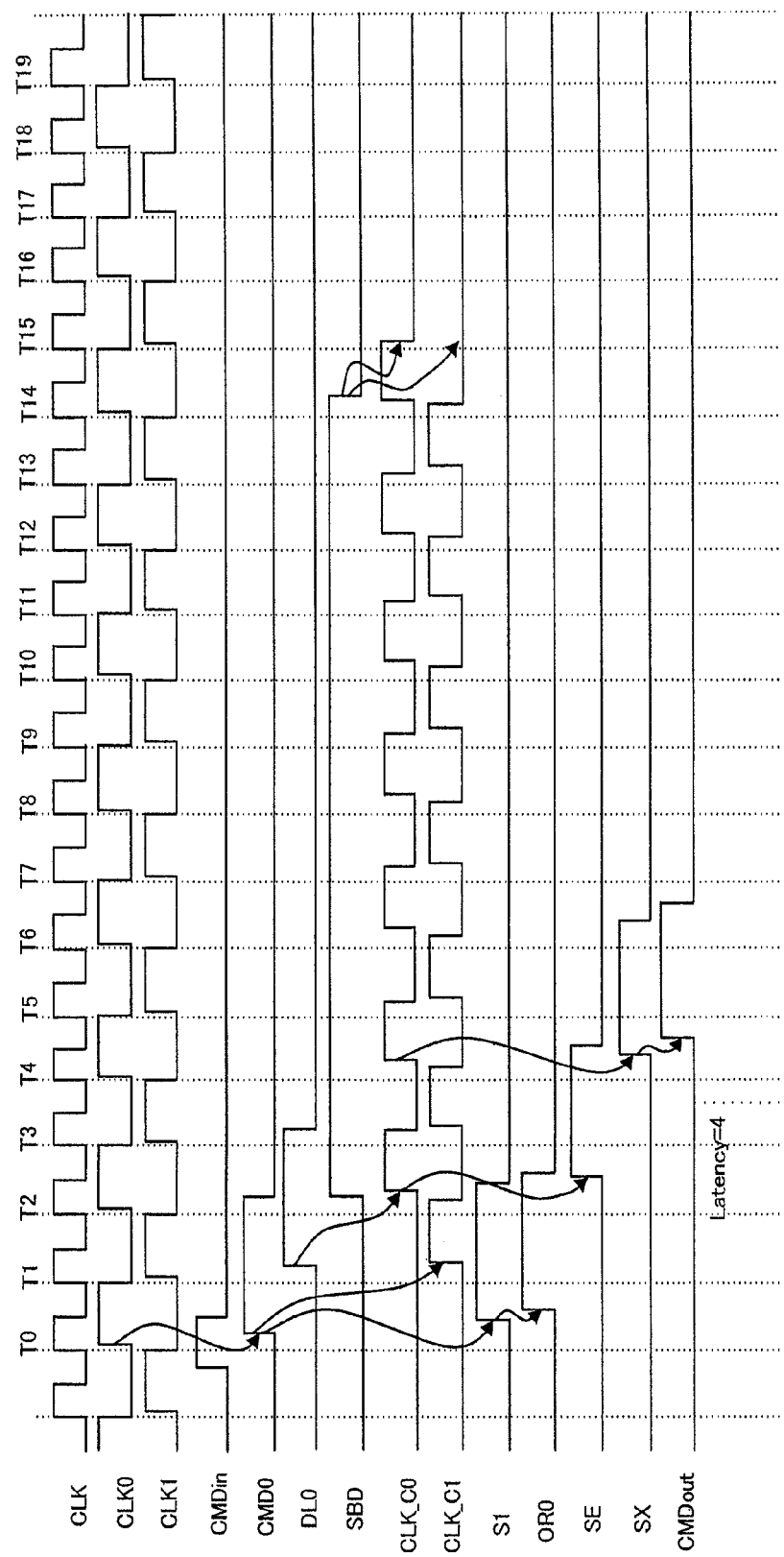
FIG. 9 is a diagram showing an example of operation waveforms when an even latency 4 is set in the second embodiment.
Figure 10:
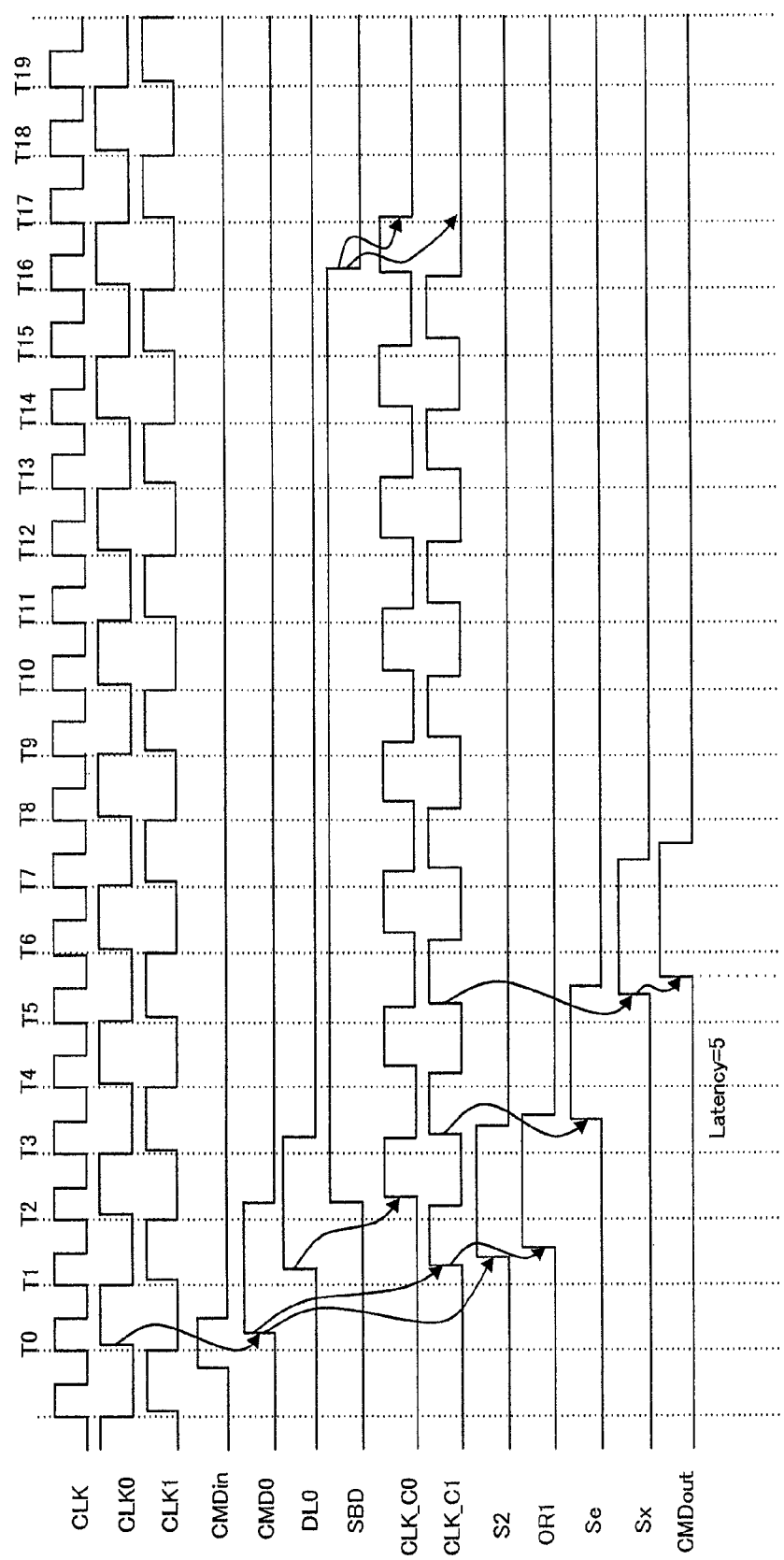
FIG. 10 is a diagram showing an example of operation waveforms when an odd latency 5 is set in the second embodiment.
Figure 11:
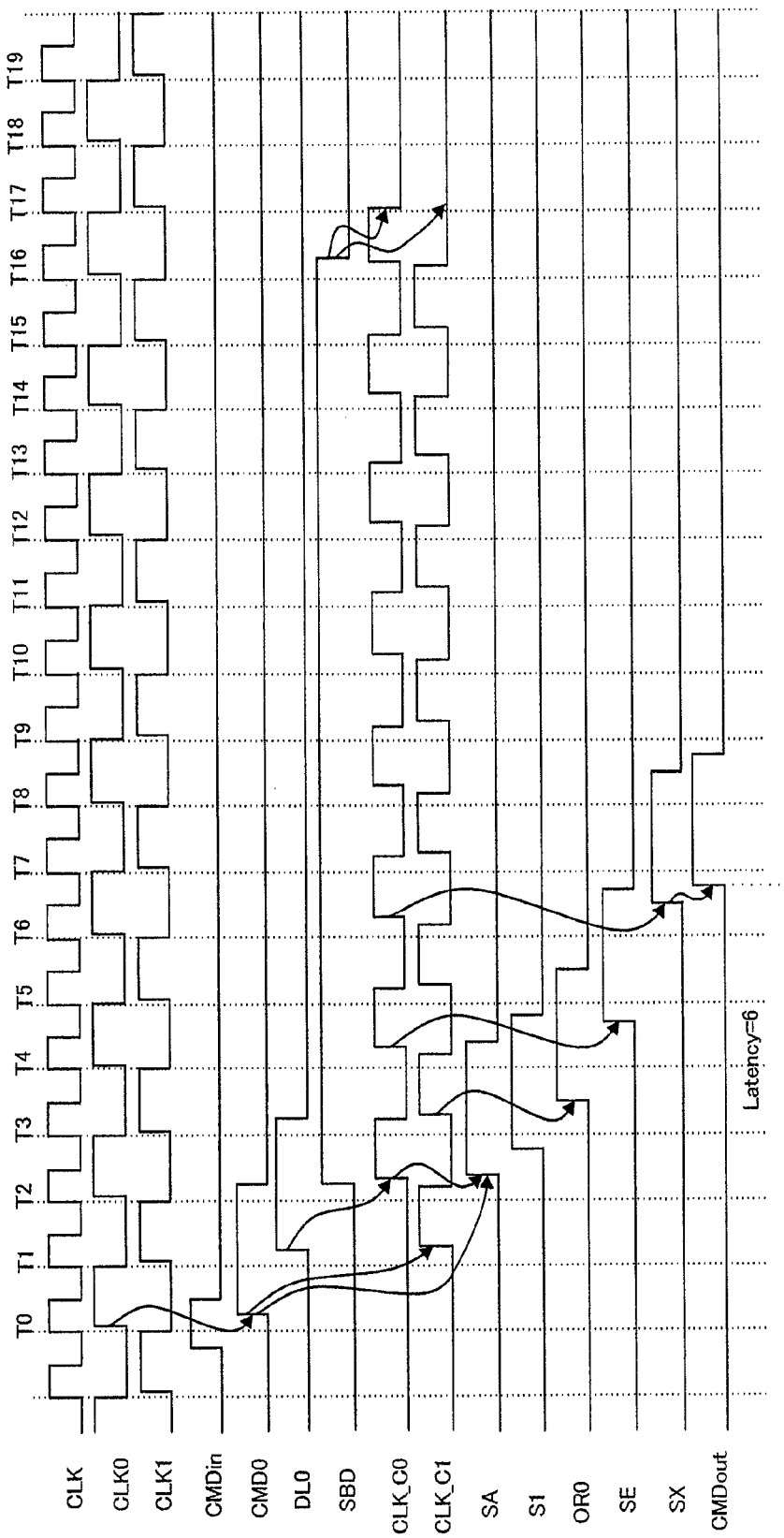
FIG. 11 is a diagram showing an example of operation waveforms when an even latency 6 is set in the second embodiment.
Figure 12:
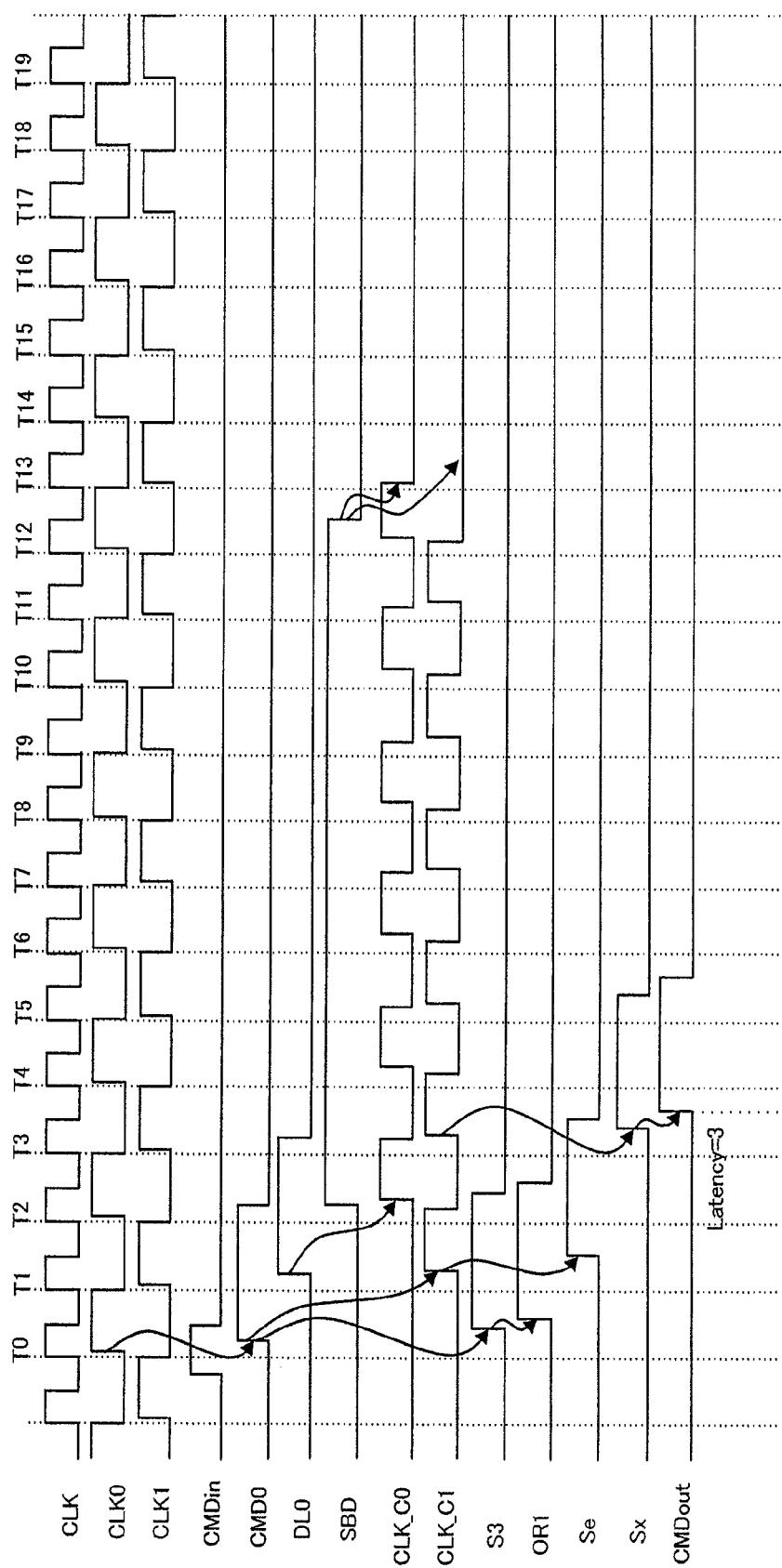
FIG. 12 is a diagram showing an example of operation waveforms when a minimum odd latency 3 is set in the second embodiment.

Counting operation of the latency in the second embodiment will be described with reference to FIGS. 9 to 12. FIG. 9 is an example of operation waveforms when the even latency 4 is set, FIG. 10 is an example of operation waveforms when the odd latency 5 is set, FIG. 11 is an example of operation waveforms when an even latency 6 is set, and FIG. 12 is an example of operation waveforms when the minimum odd latency 3 is set. In FIGS. 9 to 12, the external clock CLK, the normal-phase clock CLK0, the reverse-phase clock CLK1, the input command signal CMDin and the normal-phase command signal CMD0 have the same operation waveforms as those in FIGS. 4 to 6 of the first embodiment, so description thereof is omitted.

First, the counting operation when the even latency 4 is set will be described using FIG. 9. As shown in FIG. 9, the delayed command signal DL0 which is delayed by the delay element 101 of the clock control circuit 18a is obtained based on the normal-phase command signal CMD0. Then, an output signal of the OR gate 102 and the burst detection signal SBD, which is the same pulse as in FIG. 4, are input to one terminal of the OR gate 103. Since the reverse-phase command signal CMD1 input to the other terminal of the OR gate 103 is not activated, the delayed command signal DL0 is latched into the D flip flop 104 through the OR gate 103. Thereafter, the normal-phase control clock CLK_C0 is activated through the AND gate 105 at cycle T2 at which the normal-phase clock CLK0 subsequently rises.

Meanwhile, the normal-phase command signal CMD0 is also input to one terminal of the OR gate 113 of the clock control circuit 18a on the reverse-phase side. At this point, since the reverse-phase command signal CMD1 is in an inactive state, the output signal of the OR gate 113 changes depending on the normal-phase command signal CMD0. Thus, the normal-phase command signal CMD0 is latched into the D flip flop 114 at cycle T1 at which the reverse-phase clock CLK1 subsequently rises, and thereafter the reverse-phase control clock CLK_C1 is activated through the AND gate 115

Thereafter, control is performed for the same operation waveforms of the burst detection signal SBD, the signal S1, the signal OR0, the signal SX and the output command signal CMDout, and the same signal path, as those in FIG. 4 of the first embodiment, so description thereof is omitted. Further, since latching of the D flip flop 25 is performed in synchronization with the normal-phase control clock CLK_C0 of the second embodiment, timing of the signal SE slightly differs from that of the first embodiment, however this does not affect the eventual counting operation. Therefore, the even latency 4 can be counted by the counting operation of FIG. 9 in the same manner as in FIG. 4.

Next, the counting operation when the odd latency 5 is set will be described using FIG. 10. In FIG. 10, operation waveforms of the external clock CLK, the normal-phase clock CLK0, the reverse-phase clock CLK1, the input command signal CMDin, the normal-phase command signal CMD0 and the delayed command signal DL0 are the same as those in FIG. 9. Further, selection of the signal path and the burst detection signal SBD are controlled as in the same manner as the first embodiment (FIG. 5). Each waveform of the normal-phase control clock CLK_C0 and the reverse-phase control clock CLK_C1 has an additional portion of a time width 2tCK relative to FIG. 9 in conjunction with the pulse width of the burst detection signal SBD.

The normal-phase command signal CMD0 is input to the selector 42 in response to the control of the signal path, and the signal S2 rises. Thereby, the signal path is shifted from the normal-phase side to the reverse-phase side, the signal S2 reaches the OR gate 52 through the D flip flop 34 of the reverse-phase side, and the signal OR1 rises at cycle T1. The signal OR1 is input to the D flip flop 35, and the signal Se rises at the rising edge of cycle T3 of the reverse-phase control clock CLK_C1. Thereafter, waveforms of the signal Sx and the output command signal CMDout in the output command latch circuit 17 are the same as those in FIG. 5 of the first embodiment. Therefore, the odd latency 5 can be counted by the counting operation of FIG. 10 in the same manner as in FIG. 5.

Next, the counting operation when the even latency 6 is set will be described using FIG. 11. In FIG. 11, operation waveforms of the external clock CLK, the normal-phase clock CLK0, the reverse-phase clock CLK1, the input command signal CMDin, the normal-phase command signal CMD0 and the delayed command signal DL0 are the same as those in FIGS. 9 and 10. Meanwhile, the signal path for the even latency 6 is different. In the selector 41, a signal path of the signal SA of the D flip flop 21 is selected by a control signal corresponding to the even latency 6. Thus, the signal SA rises at cycle T2 at which the normal-phase command signal CMD0 is latched by the D flip flop 21.

Thereafter, operation waveforms delayed by two periods of the external clock CLK relative to FIG. 9 may be assumed for the signal S1, the signal OR0, the signal SX and the output command signal CMDout. Further, each of the burst detection signal SBD, the normal-phase control clock CLK_C0 and the reverse-phase control clock CLK_C1 has an additional portion of a time width 2tCK relative to FIG. 9. Therefore, the even latency 6 can be counted by the counting operation of FIG. 11.

Next, the counting operation when the minimum odd latency 3 is set will be described using FIG. 12. In FIG. 12, operation waveforms of the external clock CLK, the normal-phase clock CLK0, the reverse-phase clock CLK1, the input command signal CMDin, the normal-phase command signal CMD0 and the delayed command signal DL0 are the same as those in FIGS. 9 to 11. Meanwhile, a signal path through which the normal-phase command signal CMD0 is shifted via the selector 43 of the reverse-phase side is used as the signal path for the minimum odd latency 3 in the same manner as in FIG. 6 of the first embodiment. The signal path of the normal-phase command signal CMD0 is selected in the selector 43, and the signal S3 rises at cycle T0. The signal S3 is input to the OR gate 52, and the signal OR1 rises at a slightly delayed timing relative to the signal S3.

Thereafter, operation waveforms delayed by two periods of the external clock CLK relative to FIG. 10 may be assumed for the signal Sx and the output command signal CMDout. Further, each of waveforms of the burst detection signal SBD, the normal-phase control clock CLK_C0 and the reverse-phase control clock CLK_C1 is shortened by a time width 4tCK relative to FIG. 10. Therefore, the minimum odd latency 3 can be counted by the counting operation of FIG. 12.

Here, in case of the minimum odd latency 3, the normal-phase command signal CMD0 is input to the latency counter circuit 12a, and immediately thereafter it is latched by the D flip flop 35 at which the signal path has been shifted. At this point, if the latch timing of the D flip flop 35 is not assured at cycle T1, the subsequent counting operation will be a failure. By employing the configuration of the clock control circuits 18a of the second embodiment, the reverse-phase control clock CLK_C1 can be activated from cycle T1 using the normal-phase command signal CMD0, and thus sufficient operating margin can be obtained for the minimum odd latency 3.

In the second embodiment, counting operations for other than the above latencies can be achieved by setting the same signal path as that in FIG. 7 of the first embodiment. Further, counting operations on the reverse-phase side can be achieved by assuming a configuration in which a signal path inversed upside down in FIG. 8 is formed when the reverse-phase command signal CMD1 is input, as in the first embodiment.

As described above, the synchronous semiconductor memory device of the second embodiment is configured so that the normal-phase control clock CLK_C0 or the reverse-phase control clock CLK_C1 is applied to all the D flip flops 21 to 25, 31 to 35, 71 and 72 which are used for the counting operation. Therefore, the consumption current can be further reduced in comparison with the first embodiment. That is, when the burst detection signal SBD is not activated, all the D flip flops do not operate so that the effect of reducing the consumption current is improved. In the clock control circuit 18a of the normal-phase side, clock control is performed based on the delayed command signal DL0 obtained by delaying the normal-phase command signal CMD0 using the delay element 101 and based on the reverse-phase command signal CMD1. In the clock control circuit 18a of the reverse-phase side, symmetrical clock control is performed. Accordingly, the operation timing can be assured immediately after the signal path is shifted, and sufficient operating margin can be obtained for the counting operation.

(Modifications)

Figure 13:
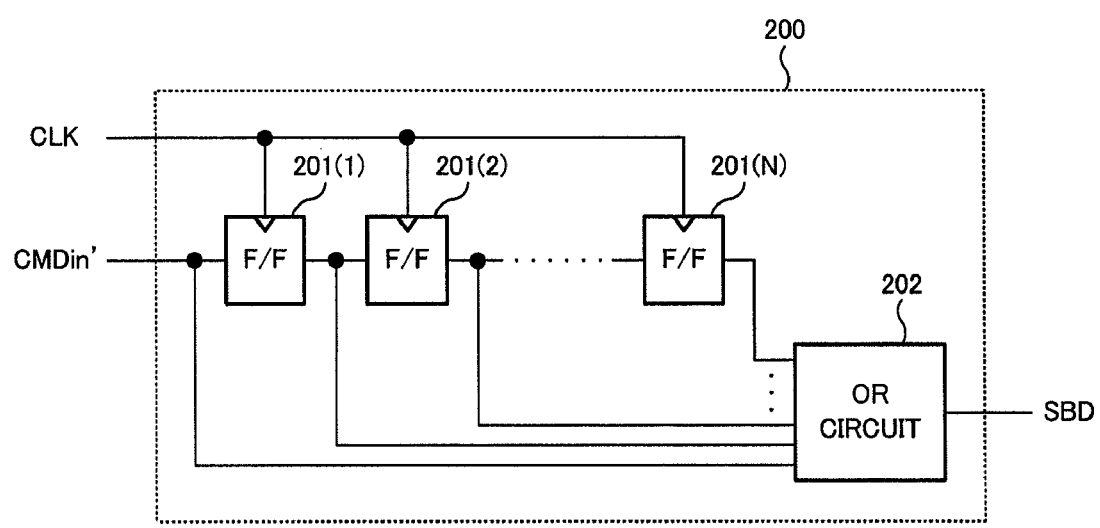
FIG. 13 is a diagram showing a configuration of a burst detection counter 200 of a first modification.
Figure 14:
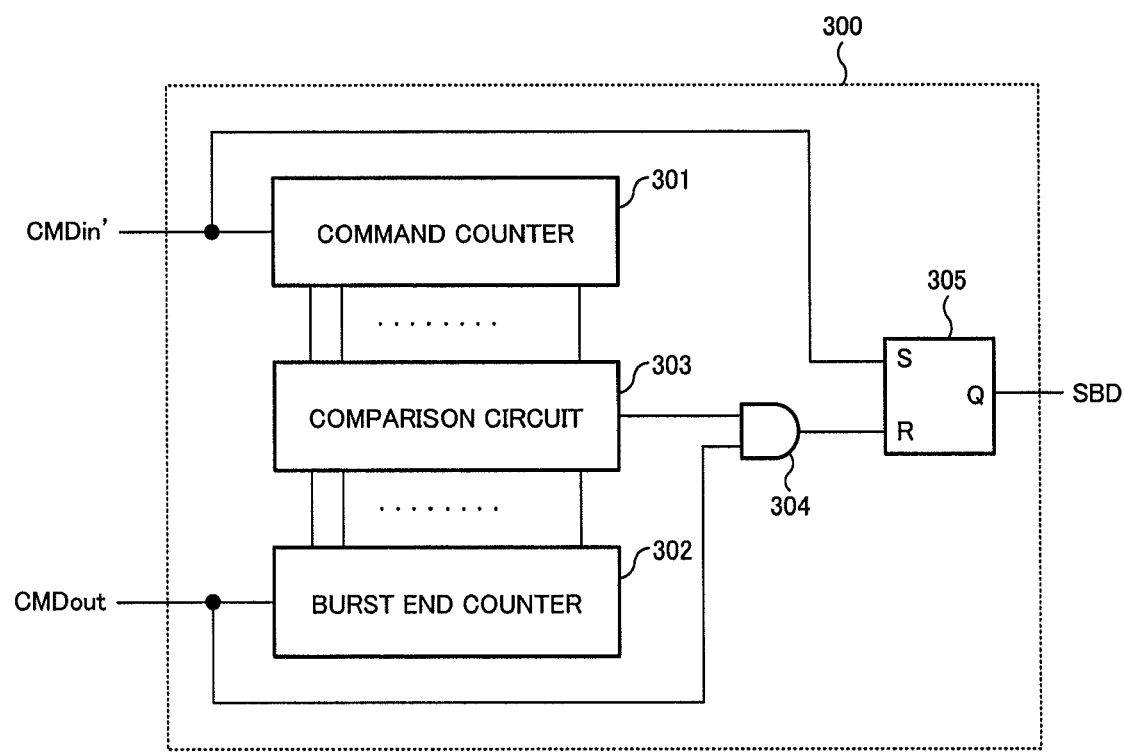
FIG. 14 is a diagram showing a configuration of a burst detection counter 300 of a second modification.

Next, modifications of the synchronous semiconductor memory device of the first and second embodiments will be described. These modifications relate to a specific configuration of the burst detection counter 64 included in the input command latch circuit 16 (FIG. 3) of the first and second embodiments. FIG. 13 shows a configuration of a burst detection counter 200 of a first modification, and FIG. 14 shows a configuration of a burst detection counter 300 of a second modification. In FIGS. 13 and 14, the OR output of the OR gate 63 of FIG. 3 is represented as an input command signal CMDin'. Further, a feature of the burst detection counter 300 of FIG. 14 is that the output command signal CMDout (not shown in FIG. 3) is inputted thereto.

The burst detection counter 200 of the first modification is composed of N (N is an integer greater than 2) D flip flops 201 and an OR circuit 202 as shown in FIG. 13. The N D flip flops 201 have a structure in which D flip flops 201(1), 201(2) to 201(N) are connected in cascade from the first stage to the N-th stage. The input command signal CMDin' is inputted to the first-stage D flip flop 201(1) and is sequentially shifted through respective stages of the D flip flops 201(1) to 201(N) in synchronization with edges of the external clock CLK. The OR circuit 202 receives the input command signal CMDin' and outputs of the respective stages of the D flip flops 201(1) to 201(N) to take a logical sum thereof and outputs the burst detection signal SBD.

In FIG. 13, the number N of stages of the D flip flops 201(1) to 201(N) is set in accordance with a burst period. Thus, the burst detection signal SBD outputted from the burst detection counter 200 of FIG. 13 is activated by the input command signal CMDin' and is deactivated after counting the number of cycles corresponding to the burst period. For example, when input command signals CMDin' corresponding to a plurality of commands are successively inputted, the burst detection signal SBD is activated by a first command input, maintains this state until a final command input, and is deactivated after counting the number of cycles corresponding to the burst period.

Meanwhile, the burst detection counter 300 of the second modification is composed of a command counter 301, a burst end counter 302, a comparison circuit 303, an AND gate 304 and an RS latch 305 as shown in FIG. 14. The command counter 301 receives the above input command signal CMDin' and counts the number of pulses thereof. The burst end counter 302 receives the output command signal CMDout and counts the number of pulses thereof. The comparison circuit 303 detects whether or not the count value of the command counter 301 is identical to the count value of the burst end counter 302.

The AND gate 304 receives an output of the comparison circuit 303 and the output command signal CMDout to take a logical product thereof. The RS latch 305 has a set terminal S to which the input command signal CMDin' is applied, and a reset terminal R to which an output of the AND gate 304 is applied. Thus, the RS latch 305 is set when a pulse of the input command signal CMDin' is applied, and is reset when the count value of the command counter 301 is identical to the count value of the burst end counter 302 and a pulse of the output command signal CMDout is applied. Then, the burst detection signal SBD is outputted from an output terminal Q of the RS latch 305. In addition, by appropriately setting the respective numbers of stages and initial values of the command counter 301 and the burst end counter 302, the level of the burst detection signal SBD can be changed in response to the desired number of pulses of the input command signal CMDin'.

Third Embodiment

Figure 15:
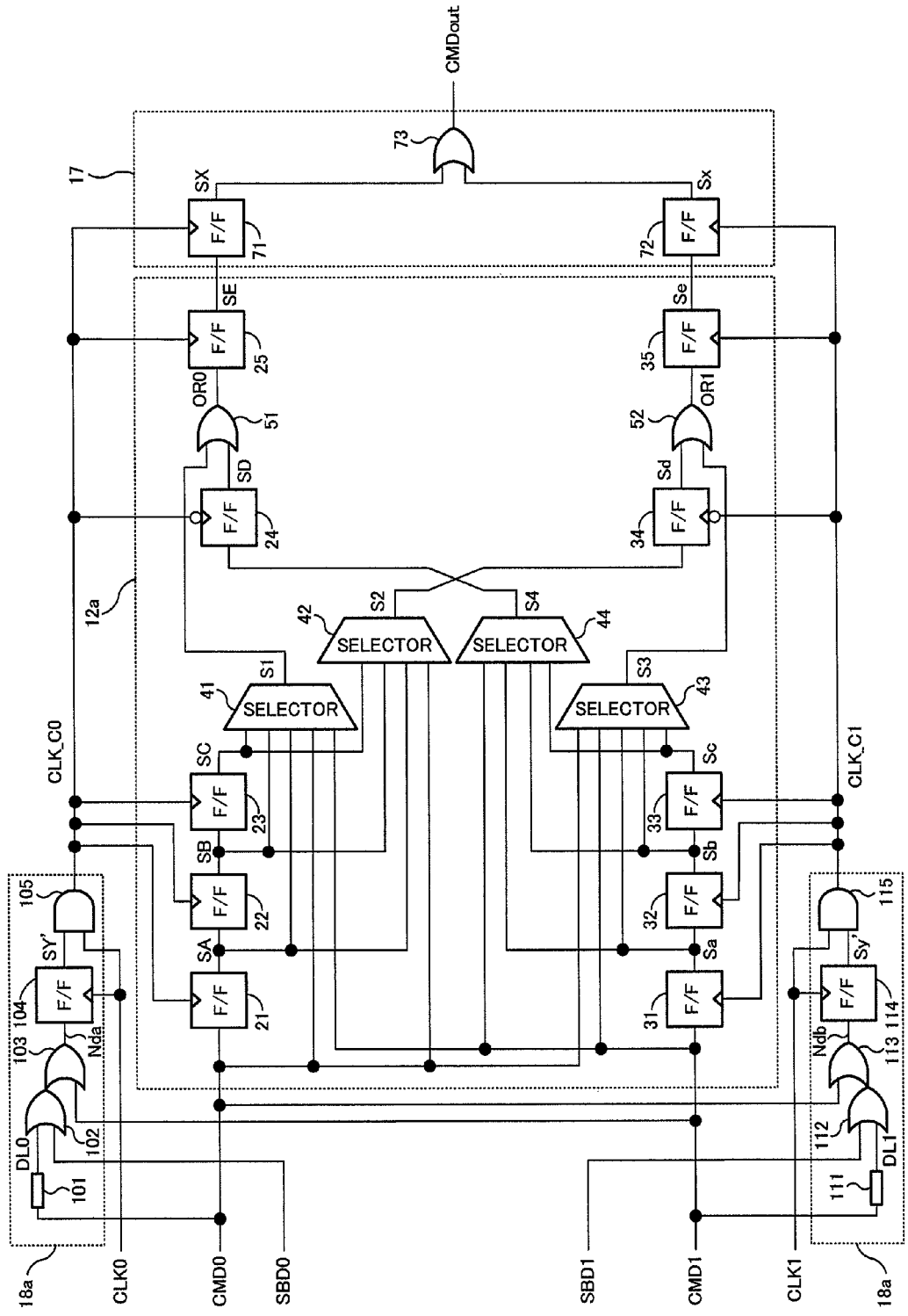
FIG. 15 is a diagram showing a configuration example of an area including a latency counter circuit 12a, an output command latch circuit 17 and clock control circuits 18a in a third embodiment.

Next, a synchronous semiconductor memory device of a third embodiment will be described. FIG. 15 shows a configuration example of an area including the latency counter circuit 12a, the output command latch circuit 17 and the two clock control circuits 18a. In FIG. 15, configurations of the latency counter circuit 12a and the output command latch circuit 17 are common to those of the second embodiment (FIG. 8), so descriptions thereof will be omitted. Meanwhile, in FIG. 15, although configurations of the two clock control circuits 18a are common to those of the second embodiment (FIG. 8), a difference is that a burst detection signal SBD0 is supplied to the clock control circuit 18a of the normal-phase side and a burst detection signal SBD1 is supplied to the clock control circuit 18a of the reverse-phase side, instead of the burst detection signal SBD. The burst detection signals SBD0 and SBD1 are two-phase signals obtained from the burst detection signal SBD. In addition, the burst detection counter 64 (FIG. 3) of the input command latch circuit 16 of the third embodiment can be configured using, for example, the burst detection counter 300 of FIG. 14.

Figure 16:
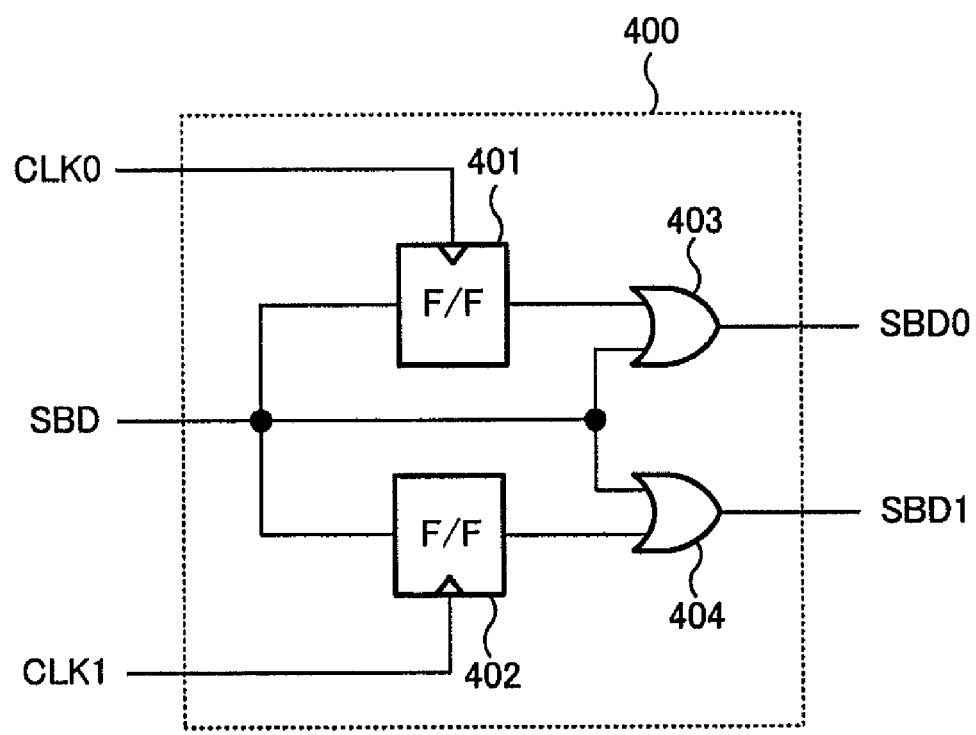
FIG. 16 is a diagram showing a configuration example of a two-phase circuit 400 in the third embodiment.

In FIG. 16, a configuration example of a two-phase circuit 400 for generating the two-phase burst detection signals SBD0 and SBD1. The two-phase circuit 400 shown in FIG. 16 is composed of two D flip flops 401 and 402 and two OR gates 403 and 404, and is attached to the input side of the configuration example of FIG. 15. One D flip flop 401 latches the burst detection signal SBD in synchronization with edges of the normal-phase clock CLK0, and the other D flip flop 402 latches the burst detection signal SBD in synchronization with edges of the reverse-phase clock CLK1. One OR gate 403 takes a logical sum of an output of one D flip flop 401 and the burst detection signal SBD and outputs one burst detection signal SBD0. The other OR gate 404 takes a logical sum of an output of the other D flip flop 402 and the burst detection signal SBD and outputs the other burst detection signal SBD1.

Returning to FIG. 15, the burst detection signal SBD0 synchronized with the normal-phase clock CLK0 is inputted to the OR gate 102 of the clock control circuit 18a of the normal-phase side. The burst detection signal SBD1 synchronized with the reverse-phase clock CLK1 is inputted to the OR gate 112 of the clock control circuit 18a of the reverse-phase side. As a result, the normal-phase control clock CLK_C0 outputted from the clock control circuit 18a of the normal-phase side is controlled to be activated and stopped in response to one burst detection signal SBD0, and the reverse-phase control clock CLK_C1 outputted from the clock control circuit 18a of the reverse-phase side is controlled to be activated and stopped in response to the other burst detection signal SBD1.

Figure 17:
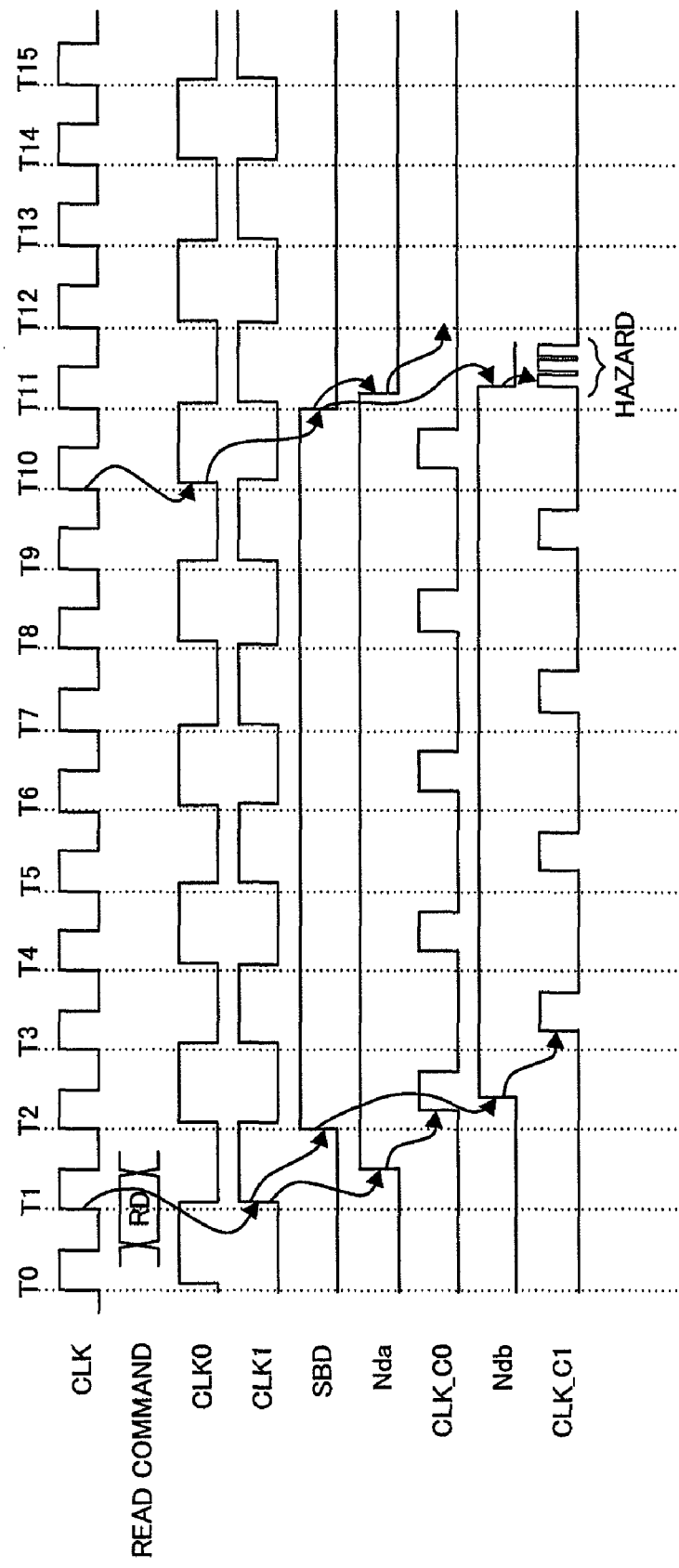
FIG. 17 is a diagram showing an example of operation waveforms when an external clock CLK with a higher-speed is inputted in the configuration of FIG. 8 of the second embodiment, which is a comparison example for explaining an effect of the third embodiment.
Figure 18:
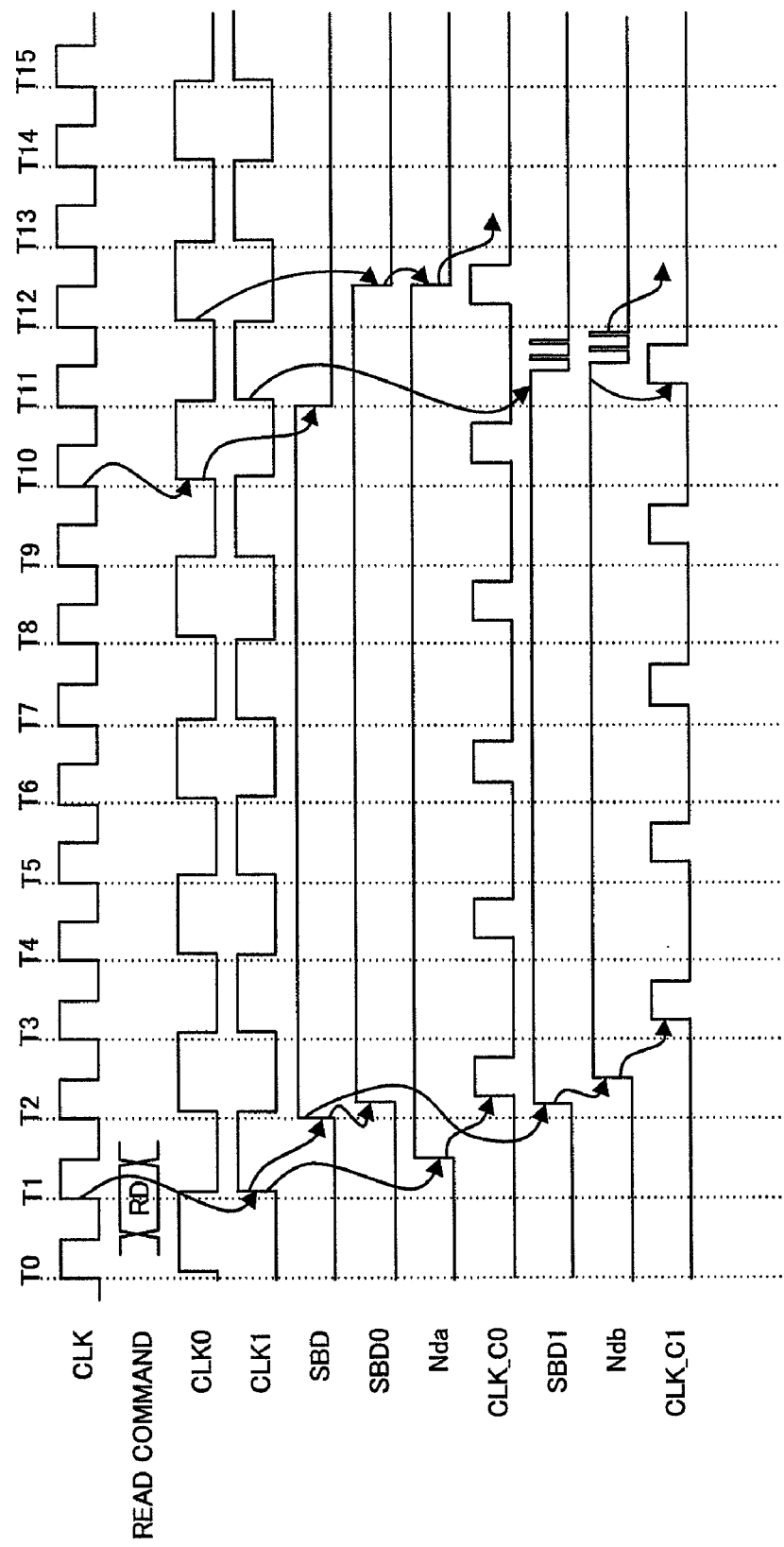
FIG. 18 is a diagram showing an example of operation waveforms in the third embodiment under the same condition as that in FIG. 17.

Next, counting operation of the latency in the third embodiment will be described, in which attention is focused on the operation of the two clock control circuits 18a. It is a feature of the third embodiment to reliably prevent a malfunction during high-speed operation by using two-phase burst detection signals SBD0 and SBD1. FIG. 17 shows an example of operation waveforms when the external clock CLK with a higher-speed than in FIGS. 9 to 12 is inputted in the configuration of FIG. 8 of the second embodiment, which is a comparison example for explaining an effect of the third embodiment. Meanwhile, FIG. 18 shows an example of operation waveforms in FIG. 15 of the third embodiment under the same condition as that in FIG. 17. Here, an odd latency 9 is set in FIGS. 17 and 18.

First, in the comparison example of FIG. 17, the normal-phase clock CLK0 and the reverse-phase clock CLK1 corresponding to the high-speed external clock CLK are inputted, and a read command (RD) is inputted as an external command at cycle T1. In this case, the pulse of the burst detection signal SBD rises at cycle T2. FIG. 17 shows respective waveforms at an output node Nda (FIG. 8) of the OR gate 103 of the clock control circuit 18a of the normal-phase side and at an output node Ndb (FIG. 8) of the OR gate 113 of the clock control circuit 18a of the reverse-phase side. In accordance with the above-mentioned operation of the clock control circuit 18a, the output node Nda of the normal-phase side becomes a high level slightly after a rising edge of the pulse of the normal-phase clock CLK1 at the cycle T1, and subsequently the normal-phase control clock CLK_C0 is activated at cycle T2. Meanwhile, the burst detection signal SBD becomes a high level at cycle T2, thereby the output node Ndb of the reverse-phase side becomes a high level at a slightly delayed timing, and subsequently the reverse-phase control clock CLK_C1 is activated at cycle T3.

Thereafter, when the burst detection signal SBD falls at cycle T11, the output nodes Nda and Ndb of the normal-phase and reverse-phase sides both become a low level in accordance with the above operation of the clock control circuits 18a. At this point, the pulse of the normal-phase control clock CLK_C0 is not outputted at the cycle T11, and the normal-phase control clock CLK_C0 is stopped in this state. In contrast, a falling edge of the output node Ndb of the reverse-phase side overlaps with an output timing of the pulse of the reverse-phase control clock CLK_C1 at the cycle T11, and thereby it is possible that a hazard (lower part of FIG. 17) occurs in the reverse-phase control clock CLK_C1. In this manner, in the comparison example of FIG. 17, since latch margin of the burst detection signal SBD corresponds to only one clock, malfunction of the latency counter possibly occurs due to the hazard in the high-speed operation.

Next, in the example of the operation of third embodiment in FIG. 18, respective waveforms of the external clock CLK, the normal-phase clock CLK0, the reverse-phase clock CLK1 and the burst detection signal SBD change in the same manner as in the comparison example of FIG. 17. Meanwhile, when the burst detection signal SBD rises, the burst detection signals SBD0 and SBD1 of the normal-phase and reverse-phase sides rise at a slightly delayed timing through the two-phase circuit 400 of FIG. 16. At this point, since the clock control circuits 18a of the normal-phase and reverse-phase sides have the same timings as those in FIG. 17, rising edges of the output nodes Nda and Ndb and respective activations of the normal-phase control clock CLK_C0 and the reverse-phase control clock CLK_C1 have the same timings as those in FIG. 17.

Thereafter, when the burst detection signal SB rises at the cycle T11, the burst detection signal SBD0 of the normal-phase side and the output node Nda of the normal-phase side are changed to a low level due to the operation of the two-phase circuit 400 at subsequent cycle T12. Meanwhile, the pulse of the reverse-phase clock CLK1 is outputted at the cycle T11, a change timing of the burst detection signal SBD1 of the reverse-phase side overlaps with the cycle T11, and thereby it is possible that hazards occur in the burst detection signal SBD1 and in the subsequent waveform of the output node Ndb respectively as shown in FIG. 18. However, since the timing when the hazard is transferred to the clock control circuit 18a of the reverse-phase side is delayed due to the operation of the two-phase circuit 400, the pulse of the reverse-phase control clock CLK_C1 at the cycle T11 functions properly. Since the timing when the reverse-phase control clock CLK_C1 subsequently operates is at cycle T13 after lapse of two cycles, the hazard that occurred at the cycle T11 will return to normal by the cycle T13, and thus the reverse-phase control clock CLK_C1 is not affected by the hazard. In this manner, the third embodiment enables that the latch margin for the two-phase burst detection signals SBD0 and SBD1 corresponds to two clocks so as to prevent the malfunction of the latency counter due to the hazard in the high-speed operation.

As described above, the synchronous semiconductor memory device of the third embodiment has the configuration in addition to the configuration of the second embodiment, in which the stop timing of the normal-phase control clock CLK_C0 or the reverse-phase control clock CLK_C1 is controlled in accordance with an internal two-phase clocks, not in accordance with an external one-phase clock. Therefore, it is possible to reliably suppress the occurrence of the hazard in the normal-phase control clock CLK_C0 or the reverse-phase control clock CLK_C1 in a higher-speed operation. Thus, it is possible to prevent the malfunction of the latency counter due to the transmission of the hazard. Further, control is performed so that the above-mentioned clocks are activated in only the read or write operation and the latency counter is stopped in other time periods, thereby drastically reducing consumption current.

It is apparent that the present invention is not limited to the above embodiments, but may be modified and changed without departing from the scope and spirit of the invention.

For example, a range of counted latencies or the number of connected D flip flops can be appropriately changed if required. Further, the present invention can be applied to synchronous semiconductor memory devices having various standards which require counting latencies in addition to a DDR-SDRAM. Furthermore, the configuration and operation of the clock control circuits 18 and 18a are not limited, however the present invention can be widely applied to a configuration in which a control circuit for controlling to activate and stop all or part of latch circuits is used.

Configurations for achieving the synchronous semiconductor memory device of the present invention are not limited to the configurations of the first to third embodiments. However the same function can be achieved using various configuration. Further, in the above description, the present invention is applied to the synchronous semiconductor memory device in the above embodiments, however the present invention can be applied to more general semiconductor devices.

The invention claimed is:

1. A semiconductor device comprising:
an input command circuit receiving command information and producing a first command signal based on a first clock signal and a second command signal based on a second clock signal, the first clock signal being different in phase from the second clock signal;
a first shifter circuit shifting the first command signal in response to the first clock signal;
a second shifter circuit shifting the second command signal in response to the second clock signal;
a selector circuit providing a signal path such that when an even latency is set, the first command signal is transmitted through the first shifter circuit and the second command signal is transmitted through the second shifter circuit, and when an odd latency is set, the first command signal is transmitted through the second shifter circuit and the second command signal is transmitted through the first shifter circuit.

2. The device as claimed in claim 1, wherein each of the first and second shifter circuits comprises a plurality of latch circuits and the device further comprises a control circuit controlling each of the first and second shifter circuits so that selected one or ones of the plurality of latch circuits are activated during a predetermined operation period of time responsive to a latency.

3. A semiconductor device counting a latency using a normal-phase clock and a reverse-phase clock which have phases in a mutually complementary relation and are obtained by frequency-dividing an external clock by two, comprising:
a latency setting circuit capable of selectively setting the latency within a range of a predetermined number of clock cycles of the external clock;
an input command circuit outputting a normal-phase command signal obtained by capturing an input command signal using the normal-phase clock and a reverse-phase command signal obtained by capturing the input command signal using the reverse-phase clock;
a clock control circuit outputting a normal-phase control clock controlled to be activated and stopped corresponding to a predetermined operation period defined by a setting of the latency based on the normal-phase clock, and outputting a reverse-phase control clock controlled to be activated and stopped corresponding to a predetermined operation period defined by a setting of the latency based on the reverse-phase clock;
a first counter circuit including a plurality of latch circuits sequentially shifting the normal-phase command signal based on the normal-phase clock, the first counter circuit including at least one latch circuit operating in synchronization with the normal-phase clock and at least one latch circuit operating in synchronization with the normal-phase control clock;
a second counter circuit including a plurality of latch circuits sequentially shifting the reverse-phase command signal based on the reverse-phase clock, the second counter circuit including at least one latch circuit operating in synchronization with the reverse-phase clock and at least one latch circuit operating in synchronization with the reverse-phase control clock; and
a selector circuit selectively controlling a signal path so that when an even latency is set, the normal-phase command signal is transmitted through the first counter circuit while the reverse-phase command signal is transmitted through the second counter circuit, and when an odd latency is set, the normal-phase command signal is transmitted so as to be shifted from the first counter circuit to the second counter circuit while the reverse-phase command signal is transmitted so as to be shifted from the second counter circuit to the first counter circuit,
wherein the first counter circuit includes one or more latch circuits operating in synchronization with the normal-phase clock and one or more latch circuits operating in synchronization with the normal-phase control clock, and the second counter circuit includes one or more latch circuits operating in synchronization with the reverse-phase clock and one or more latch circuits operating in synchronization with the reverse-phase control clock.

4. The semiconductor device according to claim 3, wherein in the first counter circuit, a first-stage latch circuit on an input side of the selector circuit of the plurality of latch circuits operates in synchronization with the normal-phase clock, and in the second counter circuit, a first-stage latch circuit on an input side of the selector circuit of the plurality of latch circuits operates in synchronization with the reverse-phase clock.

5. The semiconductor device according to claim 4, wherein in the first counter circuit, latch circuits on an output-side of the selector circuit operate in synchronization with the normal-phase clock, and in the second counter circuit, latch circuits on an output-side of the selector circuit operate in synchronization with the reverse-phase clock.

6. The semiconductor device according to claim 5, wherein the selector circuit is controlled so as to bypass a latch circuit at a first position after shifting of the signal path when a minimum odd latency is set.

7. The semiconductor device according to claim 3, wherein the input command circuit outputs a state signal indicating the predetermined operation period based on the normal-phase command signal and the reverse-phase command signal, and the clock control circuit controls to activate and stop the normal-phase control clock and the reverse-phase control clock using the state signal.

8. The semiconductor device according to claim 3, wherein each of the latch circuits in the first counter circuit is a D flip flop operating in synchronization with an edge of the normal-phase clock or the normal-phase control clock, and each of the latch circuits in the second counter circuit is a D flip flop operating in synchronization with an edge of the reverse-phase clock or the reverse-phase control clock.

9. A semiconductor device counting a latency using a normal-phase clock and a reverse-phase clock which have phases in a mutually complementary relation and are obtained by frequency-dividing an external clock by two, comprising:
a latency setting circuit capable of selectively setting the latency within a range of a predetermined number of clock cycles of the external clock;
an input command circuit outputting a normal-phase command signal obtained by capturing an input command signal using the normal-phase clock and a reverse-phase command signal obtained by capturing the input command signal using the reverse-phase clock;
a clock control circuit outputting a normal-phase control clock controlled to be activated and stopped corresponding to the normal-phase command signal delayed by a predetermined delay time, a predetermined operation period defined by a setting of the latency, and the reverse-phase command signal, based on the normal-phase clock, and outputting a reverse-phase control clock controlled to be activated and stopped corresponding to the reverse-phase command signal delayed by a predetermined delay time, a predetermined operation period defined by a setting of the latency, and the normal-phase command signal, based on the reverse-phase clock;

a first counter circuit including a plurality of latch circuits sequentially shifting the normal-phase command signal based on the normal-phase clock, the plurality of latch circuits in the first counter circuit operating in synchronization with the normal-phase control clock;

a second counter circuit including a plurality of latch circuits sequentially shifting the reverse-phase command signal based on the reverse-phase clock, the plurality of latch circuits in the second counter circuit operating in synchronization with the reverse-phase control clock; and a selector circuit selectively controlling a signal path so that when an even latency is set, the normal-phase command signal is transmitted through the first counter circuit while the reverse-phase command signal is transmitted through the second counter circuit, and when an odd latency is set, the normal-phase command signal is transmitted so as to be shifted from the first counter circuit to the second counter circuit while the reverse-phase command signal is transmitted so as to be shifted from the second counter circuit to the first counter circuit, wherein latch circuits in the first counter circuit operate in synchronization with the normal-phase control clock, and latch circuits in the second counter circuit operate in synchronization with the reverse-phase control clock, wherein the clock control circuit stops the normal-phase control clock in accordance with an end of the predetermined operation period detected based on the normal-phase clock, and stops the reverse-phase control clock in accordance with an end of the operation period detected based on the reverse-phase clock.

10. The semiconductor device according to claim 9,
wherein the input command circuit outputs a state signal indicating the predetermined operation period based on the normal-phase command signal and the reverse-phase command signal,
a two-phase circuit detecting a start of the predetermined period by receiving the state signal and outputting a first state signal indicating an end of the predetermined operation period based on the normal-phase clock and a second state signal indicating an end of the predetermined operation period based on the reveres-phase clock is further provided,
and the clock control circuit controls to activate and stop the normal-phase control clock using the first state signal, and controls to activate and stop the reverse-phase control clock using the second state signal.

11. The semiconductor device according to claim 10, wherein the two-phase circuit comprises:
a first D flip flop latching the state signal in synchronization with an edge of the normal-phase clock;
a second D flip flop latching the state signal in synchronization with an edge of the reverse-phase clock;
a first OR gate taking a logical sum of an output of the second D flip flop and the state signal and outputting the second state signal; and
a second OR gate taking a logical sum of an output of the first D flip flop and the state signal and outputting the first state signal.

12. The semiconductor device according to claim 11, wherein the first and second state signals are activated only when performing a read or write operation.

13. The semiconductor device according to claim 9, wherein the clock control circuit activates the reverse-phase control clock when the normal-phase command signal is activated, and activates the normal-phase control clock when the reverse-phase command signal is activated.

14. The semiconductor device according to claim 13, wherein when the normal-phase command signal is activated, the reverse-phase control clock is activated prior to the normal-phase control clock by one period of the external clock, and when the reverse-phase command signal is activated, the normal-phase control clock is activated prior to the reverse-phase control clock by one period of the external clock.

* * * * *